US012610859B2

(12) United States Patent (10) Patent No.: US 12,610,859 B2
Ha et al. (45) Date of Patent: Apr. 21, 2026

(54) DISPLAY DEVICE AND MANUFACTURING METHOD THEREOF FOR REDUCING PIXEL DEFECTS

(71) Applicant: Samsung Display Co., LTD., Yongin-si (KR)

(72) Inventors: Heon Sik Ha, Yongin-si (KR); Kwang Hyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 498 days.

(21) Appl. No.: 17/749,927

(22) Filed: May 20, 2022

(65) Prior Publication Data

US 2023/0017147 A1    Jan. 19, 2023

(30) Foreign Application Priority Data

Jul. 19, 2021    (KR) ........................ 10-2021-0094442

(51) Int. Cl.
*H01L 25/16*      (2023.01)
*H01L 23/00*      (2006.01)
*H10H 20/01*      (2025.01)
*H10H 20/825*     (2025.01)
*H10H 20/857*     (2025.01)

(52) U.S. Cl.
CPC ............ *H01L 25/167* (2013.01); *H01L 24/24* (2013.01); *H01L 24/82* (2013.01); *H10H 20/857* (2025.01); *H01L 24/25* (2013.01); *H01L 24/95* (2013.01); *H01L 2224/24011* (2013.01); *H01L 2224/24051* (2013.01); *H01L 2224/24147* (2013.01); *H01L 2224/245*

(2013.01); *H01L 2224/25175* (2013.01); *H01L 2224/82101* (2013.01); *H01L 2224/95133* (2013.01); *H01L 2924/01014* (2013.01); *H10H 20/0364* (2025.01); *H10H 20/8252* (2025.01)

(58) Field of Classification Search
CPC ..... H01L 33/325; H01L 33/62; H01L 25/167; H01L 2933/0066
See application file for complete search history.

(56) References Cited

U.S. PATENT DOCUMENTS 9,570,425 B2     2/2017  Do
10,367,162 B1 *  7/2019  Boardman ........... H10K 50/865
(Continued)

FOREIGN PATENT DOCUMENTS

EP           3890015 A1     10/2021
KR       10-1436123 B1     11/2014
(Continued)

*Primary Examiner* — Norman D Richards
*Assistant Examiner* — Sean Ayers Winters
(74) *Attorney, Agent, or Firm* — Womble Bond Dickinson (US) LLP

(57)           ABSTRACT

A display device includes a substrate, a light emitting element on the substrate, and including a first end portion and a second end portion that are aligned in a first direction that is substantially parallel to an upper surface of the substrate, a first contact electrode in contact with the first end portion of the light emitting element, a first electrode on the first contact electrode, and electrically connected to the first end portion of the light emitting element through the first contact electrode, and a second electrode electrically connected to the second end portion of the light emitting element.

17 Claims, 26 Drawing Sheets

(56)          References Cited

U.S. PATENT DOCUMENTS

| | | | |
|---|---|---|---|
| 11,842,988 B2 | 12/2023 | Kim et al. | |
| 12,369,437 B2 | 7/2025 | Lee et al. | |
| 2014/0373896 A1* | 12/2014 | Matsuura | H01L 31/028 |
| | | | 136/255 |
| 2019/0043917 A1* | 2/2019 | Hughes | H01L 33/486 |
| 2019/0252576 A1* | 8/2019 | Lee | G09G 3/32 |
| 2019/0288156 A1* | 9/2019 | Chaji | H01L 29/42312 |
| 2020/0144453 A1* | 5/2020 | Chang | H10H 20/857 |
| 2021/0057623 A1* | 2/2021 | Kim | H01L 33/62 |
| 2021/0343784 A1* | 11/2021 | Kwag | H01L 25/0753 |
| 2022/0052031 A1 | 2/2022 | Kang et al. | |

FOREIGN PATENT DOCUMENTS

| | | |
|---|---|---|
| KR | 10-2020-0034904 A | 4/2020 |
| KR | 10-2020-0040959 A | 4/2020 |
| KR | 10-2020-0063399 A | 6/2020 |
| KR | 10-2021-0086805 A | 7/2021 |
| WO | WO 2014/150800 A1 | 9/2014 |
| WO | WO 2020/111391 A1 | 6/2020 |
| WO | WO 2021/040162 A1 | 3/2021 |

* cited by examiner

PXL_C

CNE1    EP1

LD_C    EP2    CTE1

DR3

DR1

DISPLAY DEVICE AND MANUFACTURING METHOD THEREOF FOR REDUCING PIXEL DEFECTS

CROSS-REFERENCE TO RELATED APPLICATION

This application claims priority to, and the benefit of, Korean Patent Application No. 10-2021-0094442 filed in the Korean Intellectual Property Office on Jul. 19, 2021, the entire contents of which are incorporated herein by reference.

BACKGROUND

1. Field

The present disclosure relates to a display device and a manufacturing method thereof.

2. Description of the Related Art

Recently, interest in information display is increasing. Accordingly, research and development on display devices are continuously being conducted.

SUMMARY

The present disclosure provides a display device and a manufacturing method thereof that may reduce or prevent pixel defects.

The aspects of the present disclosure are not limited to the aspect mentioned above, and other aspects that are not mentioned may be clearly understood to a person of an ordinary skill in the art using the following description.

One or more embodiments of the present disclosure provide a display device, including a substrate, a light emitting element on the substrate, and including a first end portion and a second end portion that are aligned in a first direction that is substantially parallel to an upper surface of the substrate, a first contact electrode in contact with the first end portion of the light emitting element, a first electrode on the first contact electrode, and electrically connected to the first end portion of the light emitting element through the first contact electrode, and a second electrode electrically connected to the second end portion of the light emitting element.

The display device may further include a bank on the substrate in a non-light emitting area, and defining a light emitting area of a pixel, wherein the light emitting element is between the first electrode and the second electrode in the light emitting area.

The first contact electrode may include an amorphous silicon.

The first contact electrode may be doped with an n-type impurity.

The first contact electrode may be doped with a p-type impurity.

A thickness of the first contact electrode may be about 1000 Å or less.

The display device may further include a first alignment electrode and a second alignment electrode on the substrate, and spaced apart from each other in the first direction, and a first insulation pattern covering the first alignment electrode and the second alignment electrode, wherein the light emitting element is on the first insulation pattern between the first alignment electrode and the second alignment electrode.

The display device may further include a second insulation pattern on the light emitting element, and exposing the first end portion and the second end portion of the light emitting element.

One end portion of the first contact electrode and one end portion of the first electrode may be in contact with a side surface of the second insulation pattern, wherein the one end portion of the first contact electrode and the one end portion of the first electrode have a same etching profile.

The second insulation pattern may have a reverse tapered cross-sectional shape.

The second insulation pattern may be partially on the first electrode.

The first contact electrode may be spaced apart from the second insulation pattern, wherein the first electrode covers the first contact electrode.

The display device may further include a second contact electrode in contact with the second end portion of the light emitting element, wherein the second electrode is on the second contact electrode, and is electrically connected to the second end portion of the light emitting element through the second contact electrode.

The first contact electrode and the second contact electrode may be at a same layer.

The first electrode and the second electrode may be at a same layer.

The first electrode and the second electrode may be at different layers.

The first contact electrode and the second contact electrode may be at different layers with an insulation pattern interposed therebetween.

One or more other embodiments of the present disclosure provide a manufacturing method of a display device, including aligning light emitting elements on a substrate using a first alignment electrode and a second alignment electrode, forming a contact electrode layer on the substrate using a chemical vapor deposition method, forming a first contact electrode by etching the contact electrode layer, the first contact electrode being in contact with a first end portion of at least one of the light emitting elements, and forming a first electrode on the first contact electrode.

The forming of the first electrode may include forming an electrode layer on the contact electrode layer, and concurrently forming the first contact electrode and the first electrode by collectively etching the contact electrode layer and the electrode layer.

The forming of the first electrode may include forming an insulation pattern on at least one of the light emitting elements exposed by the first contact electrode, forming an electrode layer covering the first contact electrode and the insulation pattern, and forming the first electrode by etching the electrode layer.

Particularities of other embodiments are included in the detailed description and drawings.

According to the display device and the manufacturing method thereof according to embodiments of the present disclosure, it is possible to include contact electrodes in contact with end portions of light emitting elements, and the contact electrodes may be formed through chemical vapor deposition. The contact electrodes formed through the chemical vapor deposition may have a relatively high step coverage characteristic. Accordingly, a lateral contact area of the light emitting elements with respect to the contact electrodes may be sufficiently secured, and accordingly, an increase in contact resistance or a contact defect between the light emitting elements and the contact electrodes may be reduced or prevented.

An aspect according to embodiments of the present disclosure is not limited by what is illustrated in the above, and more various effects are included in the present specification.

DETAILED DESCRIPTION

Figure 1:
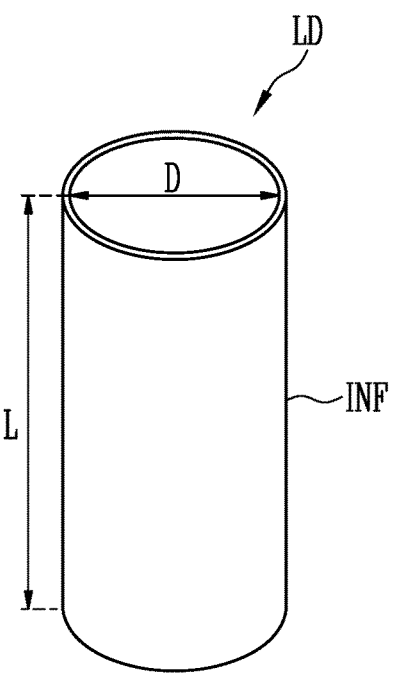
FIG. 1 illustrates a schematic perspective view of a light emitting element according to one or more embodiments.

Because the present disclosure may be variously modified and may have various forms, embodiments will be illustrated and described in detail in the following. This, however, by no means restricts the present disclosure to the disclosed embodiments, and it is to be understood as embracing all included in the spirit and scope of the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present application, it should be understood that the term "include," "comprise," "have," or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present specification, when an element of a layer, film, region, area, plate, or the like is referred to as being formed "on" another element, the formed direction is not limited to an upper direction but includes a lateral or lower direction. In contrast, when an element of a layer, film, region, plate, or the like is referred to as being "below" another element, it may be directly below the other element, or intervening elements may be present.

It is to be understood that, in the present application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there is no other constituent element (for example, a third constituent element) between the one constituent element and the another constituent element.

Hereinafter, with reference to accompanying drawings, embodiments of the present disclosure for those skilled in the art to understand the contents of the present disclosure will be described in more detail. In the description below, singular forms are to include plural forms unless the context clearly indicates only the singular.

Aspects of some embodiments of the present disclosure and methods of accomplishing the same may be understood more readily by reference to the detailed description of embodiments and the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
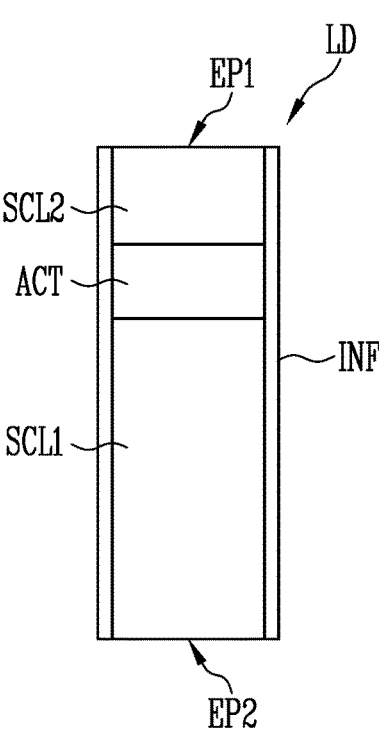
FIG. 2 illustrates a cross-sectional view of the light emitting element of FIG. 1.

FIG. 1 illustrates a schematic perspective view of a light emitting element according to one or more embodiments. FIG. 2 illustrates a cross-sectional view of the light emitting element of FIG. 1. In one or more embodiments of the present disclosure, a type and/or shape of the light emitting element is not limited to embodiments shown in FIG. 1 and FIG. 2.

Referring to FIG. 1 and FIG. 2, a light emitting element LD includes a first semiconductor layer SCL1 and a second semiconductor layer SCL2, and an active layer ACT interposed between the first and second semiconductor layers SCL1 and SCL2. For example, the light emitting element LD may include the first semiconductor layer SCL1, the active layer ACT, and the second semiconductor layer SCL2 sequentially stacked along a length L direction.

The light emitting element LD may be provided to have a rod shape extending along one direction. When the extending direction of the light emitting element LD is the length L direction, the light emitting element LD may have a first end portion EP1 and a second end portion EP2 along the length L direction.

One of the first and second semiconductor layers SCL1 and SCL2 may be located on the first end portion EP1 of the light emitting element LD. In addition, the remaining one of the first and second semiconductor layers SCL1 and SCL2 may be located on the second end portion EP2 of the light emitting element LD. For example, the second semiconductor layer SCL2 may be located on the first end portion EP1 of the light emitting element LD, and the first semiconductor layer SCL1 may be located on the second end portion EP2 of the light emitting element LD.

In one or more embodiments, the light emitting element LD may be a rod-shaped light emitting element (also referred to as a "rod-shaped light emitting diode") manufactured in a rod shape through an etching method or the like. In the present specification, the "rod shape" refers to a rod-like shape or bar-like shape (that is, with an aspect ratio greater than 1) that is relatively long in the length L direction, such as a circular cylinder or a polygonal cylinder, but a shape of a cross section thereof is not particularly limited. For example, the length L of the light emitting element LD may be larger than a diameter D thereof (or a width of a lateral cross-section thereof).

The light emitting element LD may have a size that is as small as nano-scale or micro-scale. For example, the light emitting element LD may each have the diameter D (or width) and/or the length L ranging from a nano scale to a micro scale. However, the size of the light emitting element LD in the present disclosure is not limited thereto. For example, the size of the light emitting element LD may be changed according to design conditions of various devices using the light emitting element LD as a light source, for example, the display device.

The first semiconductor layer SCL1 may be a first conductive semiconductor layer. For example, the first semiconductor layer SCL1 may include an N-type semiconductor layer. For example, the first semiconductor layer SCL1 may include a semiconductor material of one of InAlGaN, GaN, AlGaN, InGaN, AlN, and InN, and may include a N-type semiconductor layer doped with a first conductive dopant such as Si, Ge, Sn, or the like. In addition, the first semiconductor layer SCL1 may be formed of various materials.

The active layer ACT is located on the first semiconductor layer SCL1, and may be formed to have a single-quantum or multi-quantum well structure. A position of the active layer ACT may be variously changed according to a type of the light emitting element LD. The active layer ACT may emit light having a wavelength of about 400 nm to about 900 nm, and may have a double hetero-structure.

In one or more embodiments, a clad layer doped with a conductive dopant may be formed at an upper portion and/or a lower portion of the active layer ACT. For example, the clad layer may be formed as an AlGaN layer or an InAlGaN layer. In one or more embodiments, a material such as AlGaN and AlInGaN may be used to form the active layer ACT, and in addition, the active layer ACT may be formed of various materials.

The second semiconductor layer SCL2 is on the active layer ACT, and may include a semiconductor layer of a type that is different from that of the first semiconductor layer SCL1. For example, the second semiconductor layer SCL2 may include a P-type semiconductor layer. For example, the second semiconductor layer SCL2 may include at least one semiconductor material of InAlGaN, GaN, AlGaN, InGaN, AlN, and InN, and may include a P-type semiconductor layer doped with a second conductive dopant such as Mg. In addition, the second semiconductor layer SCL2 may be formed of various materials.

In one or more embodiments, the first semiconductor layer SCL1 and the second semiconductor layer SCL2 may have different lengths (or thicknesses) in the length L direction of the light emitting element LD. For example, the first semiconductor layer SCL1 may have a longer length (or thicker thickness) than that of the second semiconductor layer SCL2 along the length L direction of the light emitting element LD. Accordingly, the active layer ACT of the light emitting element LD may be closer to the first end portion EP1 than to the second end portion EP2.

When a voltage of a threshold voltage or more is applied to respective ends of the light emitting element LD, the light emitting device LD emits light while electron-hole pairs are combined in the active layer ACT. By controlling the light emission of the light emitting element LD by using this principle, the light emitting element LD may be used as a light source for various light emitting devices, and may be used as pixels of a display device.

In one or more embodiments, the light emitting element LD may further include an additional constituent element in addition to the first semiconductor layer SCL1, the active layer ACT, and the second semiconductor layer SCL2. For example, the light emitting element LD may additionally include one or more of a phosphor layer, an active layer, a semiconductor layer, and/or an electrode layer located on one end side of the first semiconductor layer SCL1, the active layer ACT, and/or the second semiconductor layer SCL2.

For example, the light emitting element LD may further include an electrode layer located at one end side of the second semiconductor layer SCL2. In this case, the electrode layer may be located at the first end portion EP1 of the light emitting element LD.

In addition, the light emitting element LD may further include another electrode layer located at one end side of the first semiconductor layer SCL1. For example, electrode layers may be located at the first and second end portions EP1 and EP2 of the light emitting element LD.

The electrode layers may be ohmic contact electrodes, but are not limited thereto. For example, the electrode layers may be Schottky contact electrodes.

The electrode layers may include metal or a conductive oxide. For example, the electrode layers may be formed by singly using or mixing chromium (Cr), titanium (Ti), aluminum (Al), gold (Au), nickel (Ni), an oxide thereof or alloy thereof, and ITO. Materials included in each of the electrode layers may be the same as or different from each other.

The electrode layers may be substantially transparent or translucent. Accordingly, light generated by the light emitting element LD may pass through the electrode layers to be emitted to the outside of the light emitting element LD. In one or more other embodiments, when the light generated by the light emitting element LD does not transmit through the electrode layers and is emitted to the outside of the light emitting element LD through an area excluding respective end portions of the light emitting element LD, the electrode layers may be opaque.

In one or more embodiments, the light emitting element LD may further include an insulation film INF provided on a surface thereof. The insulation film INF may be formed on the surface of the light emitting device LD so as to surround at least an outer circumferential surface of the active layer ACT, and may further surround respective areas of the first and/or second semiconductor layers SCL1 and/or SCL2.

When the light emitting element LD includes the electrode layers, the insulation film INF may or may not at least partially cover an external circumferential surface of the electrode layers. That is, the insulation film INF may be selectively formed on the surface of the electrode layers.

The insulation film INF may expose respective end portions of the light emitting element LD in the length (L) direction of the light emitting element LD. For example, the insulation film INF may expose at least one of the first and second semiconductor layers SCL1 and SCL2 and/or at least one of the electrode layers at the first and second end portions EP1 and EP2 of the light emitting element LD. In addition, in one or more other embodiments, the insulation film INF may not be provided in the light emitting element LD.

When the insulation film INF is provided to cover a surface of the light emitting element LD, for example, an external circumferential surface of the active layer ACT, it is possible to reduce or prevent the likelihood of the active layer ACT being short-circuited to at least one electrode (for example, an alignment electrode and/or a pixel electrode to be described later). Therefore, electrical stability of the light emitting element LD may be secured.

The insulation film INF may include a transparent insulation material. For example, the insulation film INF may include at least one insulating material of SiO2 or a silicon oxide (SiOx) not determined thereby, Si3N4 or a silicon nitride (SiNx) not determined thereby, Al2O3 or an aluminum oxide (AlxOy) not determined thereby, and TiO2 or a titanium oxide (TiOx) not determined thereby, but is not limited thereto. That is, the material included in the insulation film INF is not particularly limited.

When the insulation film INF is provided on the surface of the light emitting element LD, it is possible to improve life-span and efficiency thereof by reducing or minimizing surface defects of the light emitting element LD. In addition, when the insulation film INF is formed on each light emitting element LD, it is possible to reduce or prevent the likelihood of an unwanted short circuit between the light emitting elements LD occurring, even when a plurality of light emitting elements LD are located in close contact with each other.

In one or more embodiments of the present disclosure, the light emitting element LD may be manufactured through a surface treatment process. For example, when the plurality of light emitting elements LD are mixed with a fluid solution (or a solvent) and supplied to each light emitting area (for example, a light emitting area of each pixel), each light emitting element LD may be surface-treated so that the light emitting elements LD are not non-uniformly aggregated in the solution and are uniformly distributed. As a non-limiting example in this regard, the insulation film INF itself may be formed as a hydrophobic film using a hydrophobic material, or a hydrophobic film made of a hydrophobic material may be additionally formed on the insulation film INF.

The insulation film INF may be formed as a single layer or multilayer. For example, the insulation film INF may be formed as a double film.

The insulation film INF may be partially etched in at least one area, for example, at least one of an upper area and a lower area. In this case, the insulation film INF may have a rounded shape in the at least one area, but is not limited thereto.

For example, in at least one of the upper and lower areas of the insulation film INF, a portion of the insulation film INF may be partially or entirely removed. Accordingly, at least one of the first semiconductor layer SCL1, the second semiconductor layer SCL2, and the electrode layers may be partially exposed.

The light emitting element LD may be used in various types of devices that require a light source, including a display device. For example, a plurality of light emitting elements LD may be located in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
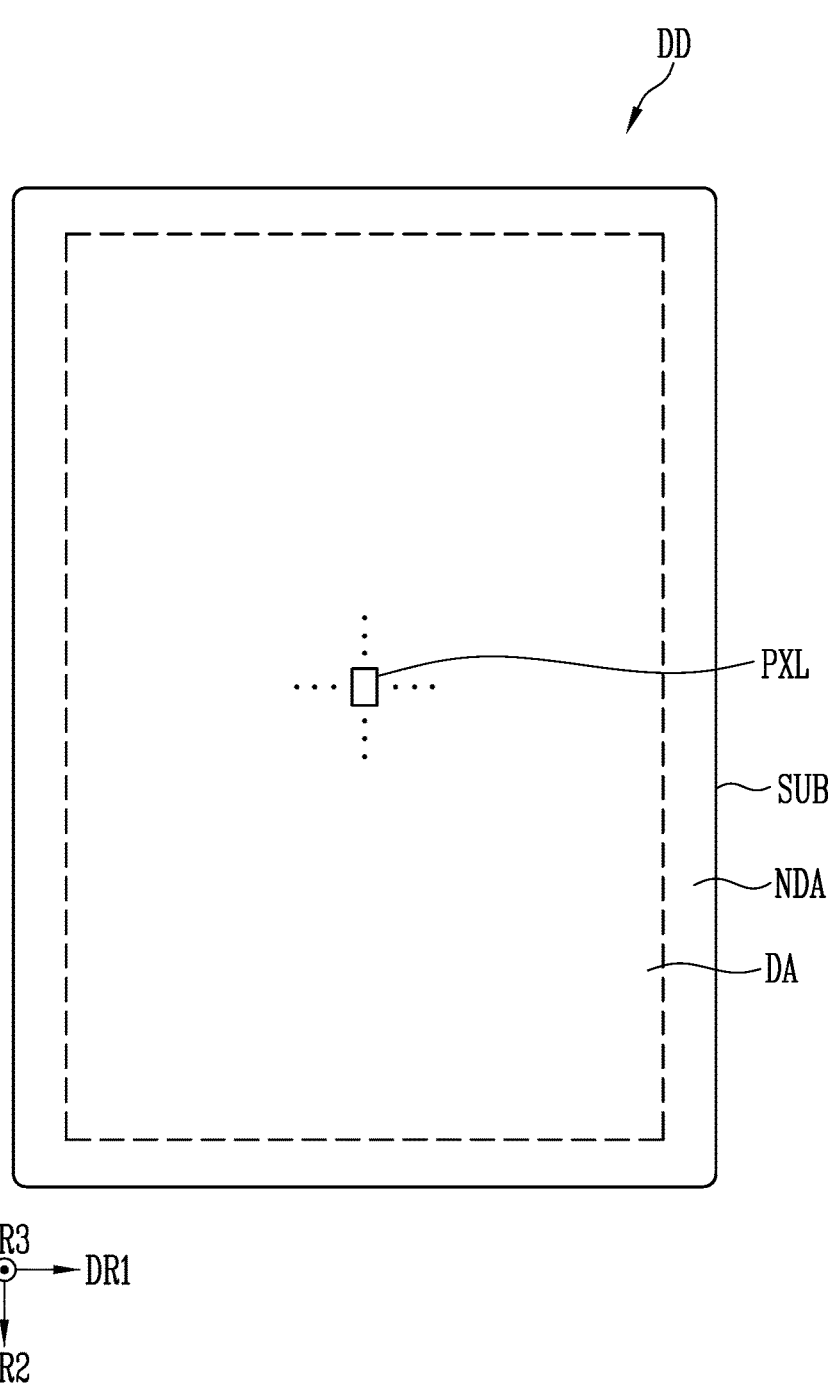
FIG. 3 illustrates a schematic top plan view of a display device according to one or more embodiments of the present disclosure.

FIG. 3 illustrates a schematic top plan view of a display device according to one or more embodiments of the present disclosure. FIG. 3 illustrates a schematic top plan view of a display device DD using the light emitting element LD shown in FIG. 1 and FIG. 2 as a light source. In FIG. 3, for convenience, a structure of the display device DD is briefly illustrated based on a display area DA on which an image is displayed.

Referring to FIG. 1 to FIG. 3, the display device DD may include a substrate SUB, a plurality of pixels PXL provided on the substrate SUB and respectively including at least one light emitting element LD, a driver provided on the substrate SUB for driving the pixels PXL, and a wire part connecting the pixels PXL and the driver.

When the display device DD is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the present disclosure may be applied thereto.

The display device DD may be classified into a passive matrix type of display device or an active matrix type of display device according to a method of driving the light emitting element LD. For example, when the display device DD is implemented as the active matrix type display device, each of the pixels PXL may include a driving transistor for controlling an amount of current supplied to the light emitting element LD, a switching transistor for transmitting a data signal to the driving transistor, and the like.

The display device DD may be provided in various shapes, and as an example, may be provided in a rectangular plate shape having two pairs of sides parallel to each other, but the present disclosure is not limited thereto. When the display device DD is provided in the rectangular plate shape, sides of one pair of the two pairs of sides may be longer than sides of the other pair. For better understanding and ease of description, a case in which the display device has a rectangular shape with a pair of long sides and a pair of short sides is illustrated, and an extending direction of the long side is indicated as the second direction DR2, an extending direction of the short side is indicated as the first direction DR1, and a direction perpendicular to the extending directions of the long and short sides is indicated as the third direction DR3. In one or more embodiments, in the display device DD provided in a shape of a rectangular plate, a corner portion at which one long side and one short side contact (or meet) each other may have a round shape.

The substrate SUB may include a display area DA and a non-display area NDA.

The display area DA may be an area in which the pixels PXL for displaying an image are provided. The non-display area NDA may be an area in which the driver for driving the pixels PXL, and a portion of the wire part connecting the driver and the pixels PXL, are provided. For better understanding and ease of description, only one pixel PXL is shown in FIG. 3, but a plurality of pixels PXL may be provided in the display area DA of the substrate SUB.

The non-display area NDA may be provided in at least one side of the display area DA. The non-display area NDA may surround a circumference (or edge) of the display area DA. The non-display area NDA may be provided with a wire part connected to the pixels PXL, and a driver connected to the wire part and for driving the pixels PXL.

The wire part may electrically connect the driver and the pixels PXL. The wire part may provide a signal to each pixel PXL, and may be signal lines connected to each pixel PXL, for example, a fan-out line connected to a scan line, a data line, a light emitting control line, and the like. In addition, the wire part is a fan-out line connected to signal lines connected to each pixel PXL, for example, connected to a control line, a sensing line, and the like, to compensate for changes in electrical characteristics of each pixel PXL in real time.

The substrate SUB may include a transparent insulation material to transmit light. The substrate SUB may be a rigid substrate or a flexible substrate.

One area on the substrate SUB is provided as the display area DA in which pixels PXL are located, and the remaining area on the substrate SUB may be provided as the non-display area NDA.

Each of the pixels PXL may be provided in the display area DA on the substrate SUB. In one or more embodiments of the present disclosure, the pixels PXL may be arranged in the display area DA in a stripe or PENTILE™ arrangement structure (PENTILE™ is a registered trademark of Samsung Display Co., Ltd., Republic of Korea), but the present disclosure is not limited thereto.

Each pixel PXL may include at least one or more light emitting element LD driven by corresponding scan and data signals. The light emitting element LD has a size as small as a micro-scale or a nano-scale, and may be mutually connected to light emitting elements located adjacent, in parallel, but the present disclosure is not limited thereto. The light emitting element LD may form a light source of each pixel PXL.

Each pixel PXL includes at least one light source, for example, the light emitting element LD shown in FIG. 1 and FIG. 2 driven by a signal (e.g., a predetermined signal, such as, for example, a scan signal and a data signal) and/or a power source (e.g., a predetermined power source, such as, for example, a first driving power source and a second driving power source). However, in one or more embodiments of the present disclosure, the type of the light emitting element LD that may be used as the light source of each pixel PXL is not limited thereto.

The driver may provide a predetermined signal and a predetermined power to each of the pixels PXL through the wiring part, and thus may control driving of the pixels PXL. The driver may include a scan driver, a light emission driver, and a data driver, and a timing controller.

Figure 4:
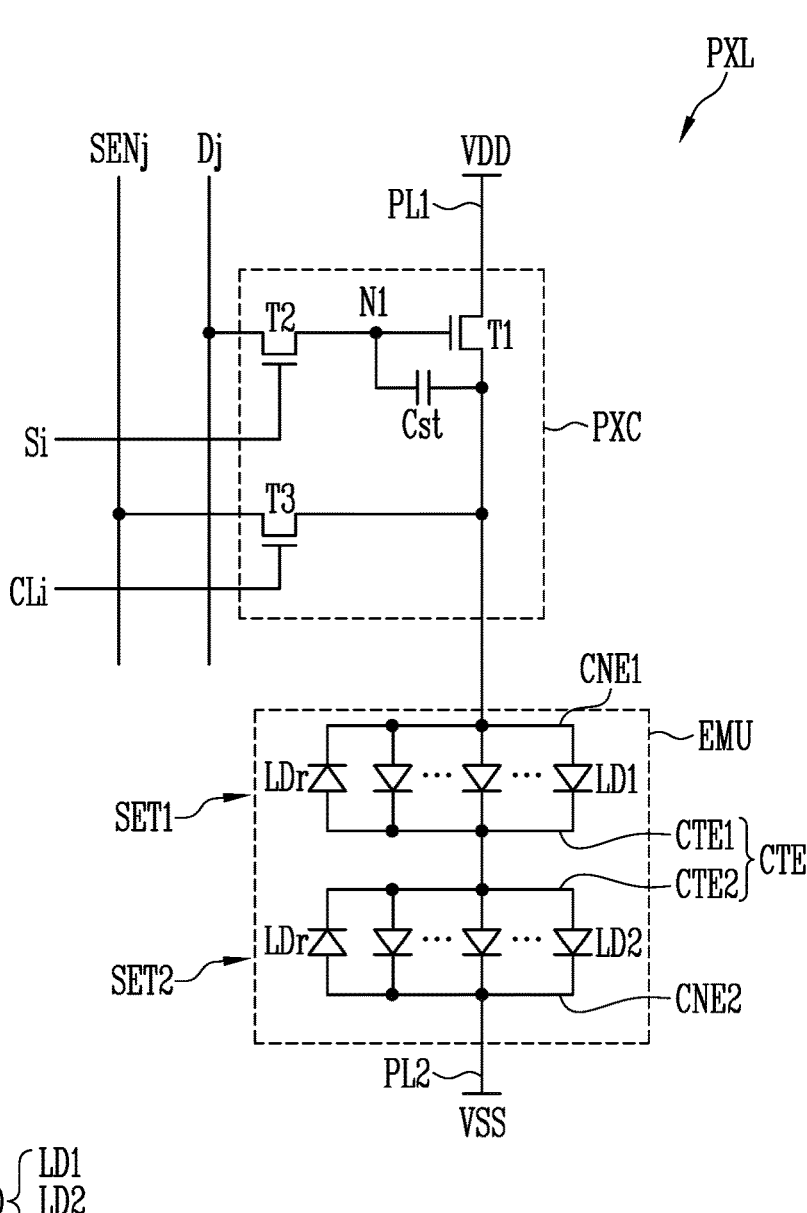
FIG. 4 illustrates a circuit diagram of an electrical connection relationship between constituent elements included in one pixel shown in FIG. 3 according to one or more embodiments.

FIG. 4 illustrates a circuit diagram of an electrical connection relationship between constituent elements included in one pixel shown in FIG. 3 according to one or more embodiments.

For example, FIG. 4 illustrates an electrical connection relationship between constituent elements included in a pixel PXL applicable to an active display device according to one or more embodiments. However, the types of constituent elements included in the pixel PXL to which one or more embodiments of the present disclosure may be applied are not limited thereto.

Referring to FIG. 3 and FIG. 4, the pixel PXL may include a light emitting unit EMU that generates light with luminance corresponding to a data signal. In addition, the pixel PXL may further selectively include a pixel circuit PXC for driving the light emitting unit EMU.

The pixel circuit PXC may be connected to a scan line and to a data line of the pixel PXL. For example, when the pixel PXL is located in an i-th (i is a natural number) row and a j-th (j is a natural number) column of the display area DA, the pixel circuit PXC of the pixel PXL may be connected to an i-th scan line Si and a j-th data line Dj of the display area DA. In addition, the pixel circuit PXC may be connected to an i-th control line CLi and a j-th sensing line SENj of the display area DA.

The pixel circuit PXC described above may include first to third transistors T1 to T3 and a storage capacitor Cst.

A first terminal of the second transistor T2 (switching transistor) may be connected to the j-th data line Dj, and a second terminal thereof may be connected to a first node N1. Here, the first terminal and the second terminal of the second transistor T2 are different terminals, and for example, when the first terminal is a drain electrode, the second terminal may be a source electrode. In addition, a gate electrode of the second transistor T2 may be connected to the i-th scan line Si.

The second transistor T2 is turned on when a scan signal of a voltage capable of turning on the second transistor T2 is supplied from the i-th scan line Si to electrically connect the j-th data line Dj and the first node N1. In this case, a data signal of a corresponding frame is supplied to the j-th data line Dj, and accordingly, the data signal is transmitted to the first node N1. The data signal transmitted to the first node N1 is charged in the storage capacitor Cst.

A first terminal of the first transistor T1 (driving transistor) may be connected to a first driving power source VDD, and a second terminal thereof may be electrically connected to a first electrode CNE1 of each of the light emitting elements LD. A gate electrode of the first transistor T1 may be connected to a first node N1. The first transistor T1 may control an amount of driving current supplied to the light emitting elements LD in response to a voltage of the first node N1.

The third transistor T3 may be connected between the first transistor T1 and the j-th sensing line SENj. For example, a first terminal of the third transistor T3 may be connected to the second terminal of the first transistor T1 connected to the first electrode CNE1, and a second terminal of the third transistor T3 may be connected to the j-th sensing line SENj. A gate electrode of the third transistor T3 may be connected to the i-th control line CLi. The third transistor T3 is turned on by a control signal of a gate-on voltage supplied to the i-th control line CLi during a sensing period (e.g., a predetermined sensing period) to electrically connect the j-th sensing line SENj to the first transistor T1.

The sensing period may be a period for extracting characteristic information (for example, a threshold voltage of the first transistor T1) of each of the pixels PXL located in the display area DA.

One electrode of the storage capacitor Cst may be connected to the second terminal of the first transistor T1, and the other electrode may be connected to the first node N1. The storage capacitor Cst may charge a voltage corresponding to the data signal supplied to the first node N1, and may maintain the charged voltage until a data signal of a next frame is supplied.

The light emitting unit EMU may include a plurality of light emitting elements LD connected in parallel between a first power line PL1 to which the voltage of the first driving power source VDD is applied, and a second power line PL2 to which the voltage of the second driving power source VSS is applied. For example, the light emitting unit EMU may include a first electrode CNE1 connected to the first power source VDD via the pixel circuit PXC and the first power line PL1, a second electrode CNE2 connected to a second power source VSS through the second power line PL2, and a plurality of light emitting elements LD connected in parallel in the same direction between the first and second electrodes CNE1 and CNE2.

Each of the light emitting elements LD included in the light emitting unit EMU may include one end portion connected to the first driving power source VDD through the first electrode CNE1, and the other end portion connected to the second driving power source VSS through the second electrode CNE2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to, or higher than, a threshold voltage of the light emitting elements LD during a light emitting period of the pixel PXL.

As described above, respective light emitting elements LD connected in parallel in the same direction (for example, a forward direction) between the first electrode CNE1 and the second electrode CNE2 respectively supplied with voltages of different potentials may form respective effective light sources. These effective light sources may be collected to form the light emitting unit EMU of the pixel PXL.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a grayscale value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

In one or more embodiments, the light emitting unit EMU may further include at least one ineffective light source, for example, a reverse light emitting element LDr, in addition to the light emitting elements LD forming respective effective light sources. The reverse light emitting element LDr is connected in parallel between the first and second electrodes CNE1 and CNE2 together with the light emitting devices LD forming the effective light sources, but may be connected between the first and second electrodes CNE1 and CNE2 in the opposite direction with respect to the light emitting elements LD. The reverse light emitting element LDr maintains an inactive state even when a driving voltage (e.g., a predetermined driving voltage, such as, for example, a driving voltage in the forward direction) is applied between the first and second electrodes CNE1 and CNE2, thus a current does not substantially flow in the reverse light emitting element.

Each light emitting unit EMU may be configured to include at least one serial stage including a plurality of light emitting elements LD connected in parallel to each other.

That is, the light emitting unit EMU may be configured in a series/parallel mixed structure as shown in FIG. 4.

The light emitting unit EMU may include first and second serial stages SET1 and SET2 sequentially connected between the first and second driving power sources VDD and VSS. Each of the first and second serial stages SET1 and SET2 may respectively include two electrodes (CNE1 and CTE1, and CTE2 and CNE2) configuring an electrode pair of the corresponding serial stage, and a plurality of light emitting elements LD connected in parallel in the same direction between respective ones of the two electrodes (CNE1 and CTE1, and CTE2 and CNE2).

The first serial stage SET1 includes the first electrode CNE1 and the first middle electrode CTE1, and it may include at least one first light emitting element LD1 connected between the first electrode CNE1 and the first middle electrode CTE1. In addition, the first serial stage SET1 may include a reverse direction light emitting element LDr connected to the first light emitting element LD1 in an opposite direction between the first electrode CNE1 and the first middle electrode CTE1.

The second serial stage SET2 includes the second middle electrode CTE2 and the second electrode CNE2, and may include at least one second light emitting element LD2 connected between the second middle electrode CTE2 and the second electrode CNE2. In addition, the second serial stage SET2 may include a reverse direction light emitting element LDr connected to the second light emitting element LD2 in an opposite direction between the second electrode CNE2 and the second middle electrode CTE2.

The first middle electrode CTE1 of the first serial stage SET1, and the second middle electrode CTE2 of the second serial stage SET2, are integrally connected to each other. That is, the first middle electrode CTE1 and the second middle electrode CTE2 may collectively form a middle electrode CTE that electrically connects the continuous first serial stage SET1 and second serial stage SET2. When the first middle electrode CTE1 and the second middle electrode CTE2 are integrally provided, the first middle electrode CTE1 and the second middle electrode CTE2 may be different areas of the middle electrode CTE.

In one or more of the above-described embodiments, the first electrode CNE1 of the first serial stage SET1 may be an anode electrode of the light emitting unit EMU of each pixel PXL, and the second electrode CNE2 of the second serial stage SET2 may be a cathode electrode of the light emitting unit EMU.

FIG. 4 illustrates one or more embodiments in which all of the first to third transistors T1 to T3 are N-type transistors, but the present disclosure is not limited thereto. For example, at least one of the first to third transistors T1 and T3 described above may be changed to a P-type transistor. In addition, although FIG. 4 discloses one or more embodiments in which the light emitting unit EMU is connected between the pixel circuit PXC and the second driving power source VSS, the light emitting unit EMU may also be connected between the first driving power source VDD and the pixel circuit PXC in one or more other embodiments.

The structure of the pixel circuit PXC may be variously changed. For example, the pixel circuit PXC may additionally include other circuit elements such as at least one transistor element, such as a transistor element for initializing the first node N1 and/or a transistor element for controlling a light emission time of the light emitting elements LD, and/or such as a boosting capacitor for boosting the voltage of the first node N1.

The structure of the pixel PXL that may be applied to the present disclosure is not limited to one or more embodiments illustrated in FIG. 4, and the corresponding pixel PXL may have various structures. For example, each pixel PXL may be configured inside a passive light emitting display device or the like. In this case, the pixel circuit PXC may be omitted, and respective end portions of the light emitting elements LD included in the light emitting unit EMU may be directly connected to the i-th scan line Si, the j-th data line Dj, the first power line PL1 to which the first driving power source VDD is applied, the second power line PL2 to which the second driving power source VSS is applied, and/or a control line (e.g., a predetermined control line).

FIG. 4 illustrates the structure in which the light emitting unit EMU (or pixel PXL) includes a first light emitting element LD1 and a second light emitting element LD2 (or the first serial stage SET1 and the second serial stage SET2) connected to each other in series, but the present disclosure is not limited thereto. For example, the light emitting unit EMU may include only the first light emitting element LD1 or the second light emitting element LD2 (or the first serial stage SET1 or the second serial stage SET2). That is, the light emitting unit EMU may include only the light emitting elements LD connected in parallel. In this case, the middle electrode CTE may be omitted, and the first light emitting element LD1 and/or the second light emitting element LD2 may be connected to the pixel circuit PXC through the first electrode CNE1, and may be connected to the second power line PL2 through the second electrode CNE2.

Figure 5:
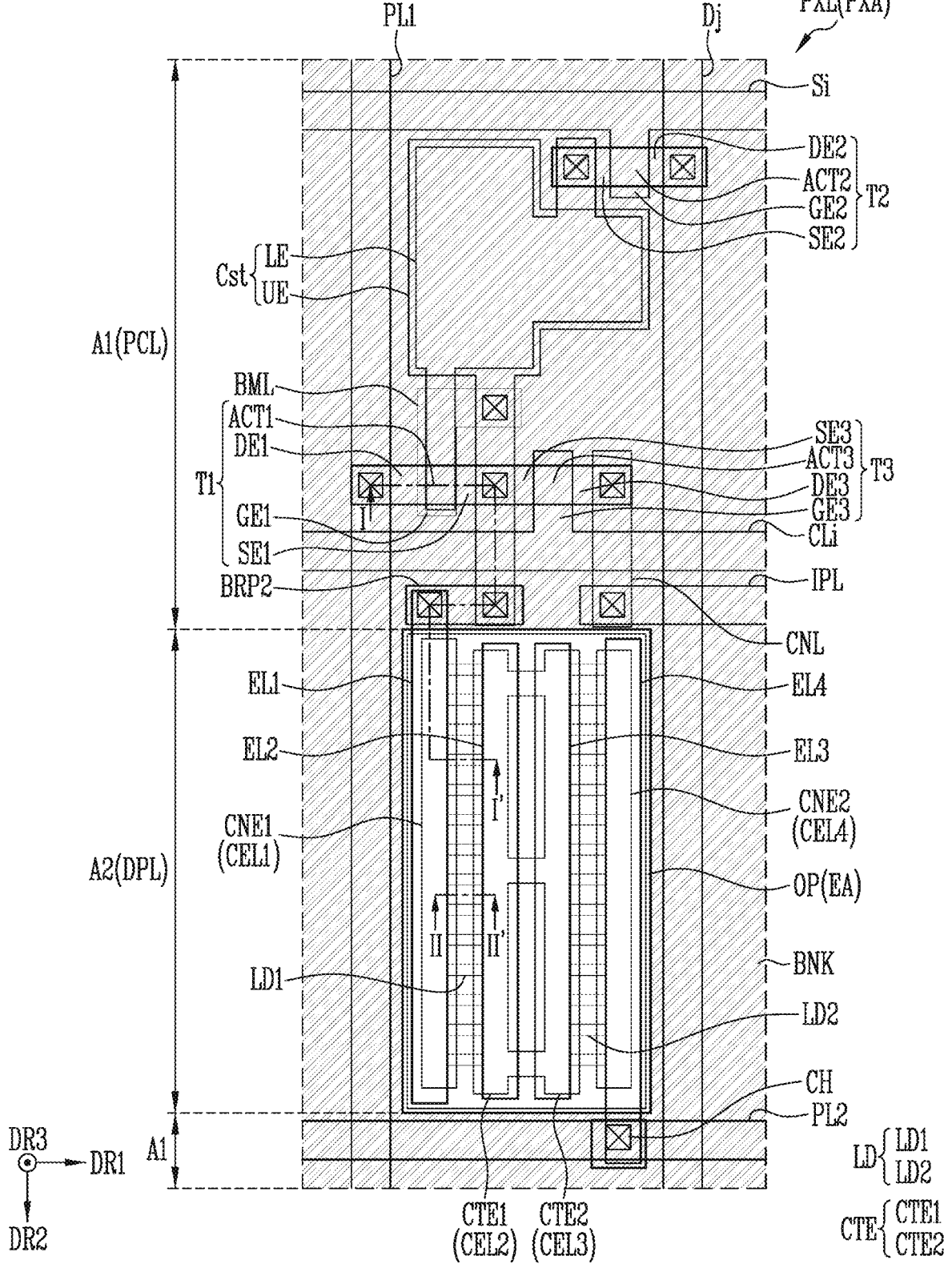
FIG. 5 illustrates a schematic top plan view of a pixel of FIG. 4.

FIG. 5 illustrates a schematic top plan view of the pixel of FIG. 4.

For convenience, in FIG. 5, the scan line Si, the control line CLi, the data line Dj, the power lines PL1 and PL2, and an initialization power line IPL that are connected to the pixel PXL are shown based on one pixel PXL located in an area in which the j-th pixel column and the i-th pixel row cross. Here, the initialization power line IPL may be the j-th sensing line SENj described with reference to FIG. 4.

In addition, for better understanding and ease of description, in the wires provided in the pixel PXL, the data line Dj of the j-th column to which a data signal is applied is referred to as a "data line Dj," the scan line of the i-th row is referred to as a "scan line (Si)," the power line to which the first driving power source VDD is applied is referred to as a "first power line PL1," and the power line to which the second driving power source VSS is applied is referred to as a "second power line PL2".

FIG. 4 and FIG. 5 illustrate one or more embodiments in which a light emitting area EA of each pixel PXL includes the light emitting elements LD located in two serial stages, but the present disclosure is not limited thereto, and the number of serial stages located to the light emitting area EA may be variously changed according to one or more embodiments.

In addition, in one or more embodiments of the present disclosure, unless otherwise described, "formed and/or provided on the same layer" means formed in the same process, and "formed and/or provided on another layer" means formed in a different process.

Referring to FIG. to FIG. 5, the pixel PXL according to one or more embodiments of the present disclosure may be at a pixel area PXA provided in the aforementioned display area DA of the substrate SUB.

A plurality of insulation layers and a plurality of conductive layers may be located on the substrate SUB. The conductive layers may be provided and/or formed between the insulation layers described above. The conductive layers may include, for example, a first conductive layer (for example, a bottom metal layer BML) provided on the substrate SUB, a second conductive layer provided on a gate insulating layer (for example, a gate electrode of a transistor), a third conductive layer (for example, a source electrode and/or a drain electrode of the transistor) provided between interlayer insulating layers, and a fourth conductive layer provided on the interlayer insulating layers (for example, a bridge pattern connecting the transistor and the light emitting unit EMU). Each of the conductive layers may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), which are a low-resistance material. A conductive layer containing a conductive material with a special characteristic will be separately described.

However, the insulation layers and the conductive layers provided on the substrate SUB are not limited to the above-described embodiments, and in some embodiments, other insulation layers and other conductive layers other than the insulation layers and the conductive layers may be provided on the substrate SUB.

A wire part electrically connected to the pixel PXL may be located on an upper surface (for example, a surface in the third direction DR3) of the substrate SUB. The wire part may include a plurality of signal lines for transmitting a signal (e.g., a predetermined signal, or a predetermined voltage) to the pixel PXL. The signal lines may include the scan line Si, the data line Dj, the control line CLi, the first power line PL1, the second power line PL2, and the initialization power line IPL.

The scan line Si may extend in the first direction DR1 (or horizontal direction). A scan signal may be applied to the scan line Si. The scan line Si may be the i-th scan line Si described with reference to FIG. 4.

The data line Dj may extend in the second direction DR2 (or vertical direction). A data signal may be applied to the data line Dj. The data line Dj may be the j-th data line Dj described with reference to FIG. 4. The data line Dj may be electrically connected to the second transistor T2 of the pixel PXL.

The control line CLi may extend along the first direction DR1 to be spaced apart from the scan line Si. A control signal may be applied to the control line CLi. The control line CLi may be the i-th control line CLi described with reference to FIG. 4. The control line CLi may be provided and/or formed on the same layer as the scan line Si.

A voltage of the first driving power source VDD may be applied to the first power line PL1. The first power line PL1 may be the first power line PL1 described with reference to FIG. 4. The first power line PL1 may extend along the second direction DR2, and may be spaced apart from the data line Dj in the pixel area PXA in the first direction DR1. The first power line PL1 may be provided on the same layer as the data line Dj.

A voltage of the second driving power source VSS may be applied to the second power line PL2. The second power line PL2 may be the second power line PL2 described with reference to FIG. 4. The second power line PL2 may extend along the first direction DR1. The second power line PL2 may be electrically connected to a fourth alignment electrode EL4 through a contact hole CH.

The initialization power line IPL may extend in the first direction DR1, and may be spaced apart from the control line CLi. The initialization power line IPL may be the j-th sensing line SENj described with reference to FIG. 4. The initialization power line IPL may be electrically connected to the third transistor T3 located in the pixel area PXA. A voltage of the initialization power source may be applied to the initialization power line IPL. The scan line Si, the control line CLi, and the initialization power line IPL may be provided and/or formed on the same layer.

The light emitting elements LD may be located in the light emitting area EA of the pixel area PXA, and circuit elements for driving the light emitting elements LD may be located in the peripheral area of the pixel area PXA.

In one or more embodiments, the pixel area PXA may include a first area A1 and a second area A2 partitioned along one direction, for example, the second direction DR2. A pixel circuit part PCL may be located in the first area A1, and a display element part DPL may be located in the second area A2. The first area A1 may correspond to a peripheral area adjacent to the light emitting area EA, and the second area A2 may correspond to the light emitting area EA. Here, the peripheral area may include a non-light emitting area from which light is not emitted.

For convenience, the pixel circuit part PCL will be first described, and then the display element part DPL will be described.

The pixel circuit part PCL may include the bottom metal layer BML located in the first area A1, a pixel circuit (see "PXC" in FIG. 4), and signal lines electrically connected to the pixel circuit PXC.

The bottom metal layer BML may be provided and/or formed on the substrate SUB. The bottom metal layer BML may be a light blocking film that blocks light introduced through a lower surface of the substrate SUB from proceeding to the first transistor T1 of the pixel PXL. For example, the bottom metal layer BML may reduce or prevent the likelihood of an erroneous operation of the first transistor T1 by blocking the light introduced through the lower surface of the substrate SUB from proceeding to the semiconductor layer of the first transistor T1. To this end, the bottom metal layer BML may be located on the substrate SUB to overlap the first transistor T1. For example, the bottom metal layer BML may be located on the substrate SUB to overlap a first gate electrode GE1 of the first transistor T1.

The bottom metal layer BML may be electrically and/or physically connected to an upper electrode UE of the storage capacitor Cst through a contact hole penetrating a plurality of insulation layers.

The upper electrode UE may overlap the bottom metal layer BML when viewed in a plan view and a cross-sectional view. The upper electrode UE may be provided on the same layer as, may include the same material as, and may be formed by the same process as the data line Dj and the first power line PL1.

One area of the upper electrode UE may be connected to the bottom metal layer BML through a contact hole penetrating a plurality of insulation layers. In addition, the other area of the upper electrode UE may be connected to a first source area SE1 of the first transistor T1 through a contact hole penetrating a plurality of insulation layers. As a result, the bottom metal layer BML may be connected to the first source area SE1 of the first transistor T1.

As described above, when the bottom metal layer BML is connected to the first source area SE1 of the first transistor T1, a swing width margin of the second driving power source VSS may be secured. In this case, a driving range of a gate voltage applied to the first gate electrode GE1 of the first transistor T1 may be widened.

The pixel circuit PXC may include first to third transistors T1 to T3 and a storage capacitor Cst provided on the substrate SUB.

The first transistor T1 may be the first transistor T1 described with reference to FIG. 4, the second transistor T2 may be the second transistor T2 described with reference to FIG. 4, and the third transistor T3 may be the third transistor T3 described with reference to FIG. 4.

The first transistor T1 may include a first gate electrode GE1, a first active pattern ACT1, a first source area SE1, and a first drain area DE1.

The first gate electrode GE1 may be connected to a second source area SE2 of the second transistor T2 through a contact hole penetrating a plurality of insulation layers.

The first active pattern ACT1, the first source area SE1, and the first drain area DE1 may be semiconductor patterns made of a polysilicon, an amorphous silicon, an oxide semiconductor, or the like. The first active pattern ACT1, the first source area SE1, and the first drain area DE1 may be formed as a semiconductor layer in which no impurity is doped, or in which an impurity is doped. For example, the first source area SE1 and the first drain area DE1 may be formed as a semiconductor layer in which an impurity is doped, and the first active pattern ACT1 may be formed as a semiconductor layer in which no impurity is doped. As the impurity, for example, an n-type impurity may be used.

The first active pattern ACT1 is an area overlapping the first gate electrode GE1, and may be a channel area of the first transistor T1. When the first active pattern ACT1 is formed to be long, the channel area of the first transistor T1 may be formed to be long. In this case, a driving range of a gate voltage (or gate signal) applied to the first transistor T1 may be widened. Accordingly, it is possible to finely control a grayscale of light emitted from the light emitting elements LD.

The first source area SE1 may be connected to (or may contact) one end of the first active pattern ACT1. In addition, the first source area SE1 may be electrically connected to the upper electrode UE through a contact hole penetrating a plurality of insulation layers.

The first drain area DE1 may be connected to (or may contact) the other end of the first active pattern ACT1. In addition, the first drain area DE1 may be connected to the first power line PL1 through a contact hole penetrating a plurality of insulation layers. Accordingly, a voltage of the first driving power source VDD may be applied to the first drain area DE1.

The second transistor T2 may include a second gate electrode GE2, a second active pattern ACT2, a second source area SE2, and a second drain area DE2.

The second gate electrode GE2 may be provided integrally with the scan line Si. In this case, the second gate electrode GE2 may be provided as a part of the scan line Si, or may be provided in a shape protruding from the scan line Si.

In one or more of the above-described embodiments, the second gate electrode GE2 is provided integrally with the scan line Si to be electrically connected to the scan line Si, but the present disclosure is not limited thereto. In one or more embodiments, the second gate electrode GE2 may be provided non-integrally with the scan line Si to be electrically connected to the scan line Si through a separate connection means or the like.

The second active pattern ACT2, the second source area SE2, and the second drain area DE2 may be semiconductor patterns made of a polysilicon, an amorphous silicon, an oxide semiconductor, or the like. The second active pattern ACT2, the second source area SE2, and the second drain area DE2 may be formed as a semiconductor layer in which no impurity is doped, or in which an impurity is doped. For example, the second source area SE2 and the second drain area DE2 may be formed as a semiconductor layer in which an impurity is doped, and the second active pattern ACT2 may be formed as a semiconductor layer in which no impurity is doped. As the impurity, for example, an n-type impurity may be used.

The second active pattern ACT2 is an area overlapping the second gate electrode GE2, and may be a channel area of the second transistor T2.

The second source area SE2 may be connected to (or may contact) one end of the second active pattern ACT2. In addition, the second source area SE2 may be connected to the first gate electrode GE1 of the first transistor T1 through a contact hole penetrating a plurality of insulation layers.

The second drain area DE2 may be connected to (or may contact) the other end of the second active pattern ACT2. In addition, the second drain area DE2 may be connected to the data line Dj through a contact hole penetrating a plurality of insulation layers.

The third transistor T3 may include a third gate electrode GE3, a third active pattern ACT3, a third source area SE3, and a third drain area DE3.

The third gate electrode GE3 may be provided integrally with the control line CLi. In this case, the third gate electrode GE3 may be provided as a part of the control line CLi, or may be provided in a shape protruding from the control line CLi.

In one or more of the above-described embodiments, the third gate electrode GE3 is provided integrally with the control line CLi to be electrically connected to the control line CLi, but the present disclosure is not limited thereto. In one or more embodiments, the third gate electrode GE3 may be provided non-integrally with the control line CLi to be electrically connected to the control line CLi through a separate connection means or the like.

The second active pattern ACT3, the second source area SE3, and the second drain area DE2 may be semiconductor patterns made of a polysilicon, an amorphous silicon, an oxide semiconductor, or the like. The third active pattern ACT3, the third source area SE3, and the third drain area DE3 may be formed as a semiconductor layer in which no impurity is doped, or in which an impurity is doped. For example, the third source area SE3 and the third drain area DE3 may be formed as a semiconductor layer in which an impurity is doped, and the third active pattern ACT3 may be formed as a semiconductor layer in which no impurity is doped. As the impurity, for example, an n-type impurity may be used.

The third active pattern ACT3 is an area overlapping the third gate electrode GE3, and may be a channel area of the third transistor T3.

The third source area SE3 may be connected to (or may contact) one end of the third active pattern ACT3. In addition, the third source area SE3 may be connected to the first source area SE1 of the first transistor T1.

The third drain area DE3 may be connected to (or may contact) the other end of the third active pattern ACT3. In addition, the third drain area DE3 may be electrically connected to the initialization power line IPL through a connection wire CNL (or a first bridge pattern).

One end of the connection wire CNL may be electrically connected to the third drain area DE3 through a contact hole penetrating a plurality of insulation layers. The other end of the connection wire CNL may be electrically connected to the initialization power line IPL through a contact hole penetrating a plurality of insulation layers.

The storage capacitor Cst may include a lower electrode LE and an upper electrode UE. Here, the storage capacitor Cst may be the storage capacitor Cst described with reference to FIG. 4.

The lower electrode LE may be provided integrally with the first gate electrode GE1. When the lower electrode LE is provided integrally with the first gate electrode GE1, the lower electrode LE may be an area of the first gate electrode GE1.

The upper electrode UE may overlap the lower electrode LE in a plan view, and may be designed to have a larger area (or size) than the lower electrode LE. The upper electrode UE may overlap the first source area SE1 and may overlap the bottom metal layer BML, in a plan view. The upper electrode UE may be provided and/or formed on the same layer as the data line Dj and the first power line PL1.

The upper electrode UE may be electrically connected to the first source area SE1 of the first transistor T1, the third source area SE3 of the third transistor T3, and the bottom metal layer BML.

The pixel circuit part PCL may further include a second bridge pattern BRP2 located in the first area A1 of the pixel area PXA.

The second bridge pattern BRP2 may be a part of the pixel circuit part PCL, for example, a part of the storage capacitor Cst and the display element part DPL, for example, an intermediate medium for electrically connecting a first alignment electrode EL1.

One end of the second bridge pattern BRP2 may be electrically connected to the upper electrode UE through a contact hole penetrating a plurality of insulation layers. The other end of the second bridge pattern BRP2 may be electrically connected to the first alignment electrode EU.

In one or more of the above-described embodiments, the data line Dj and the first power line PL1 may be provided on both the first and second areas A1 and A2 of the pixel area PXA.

A bank BNK may be provided and/or formed on the pixel circuit part PCL shown in FIG. 5.

The bank BNK may be a structure that defines (or partitions) the pixel area PXA or light emitting area EA of a corresponding pixel PXL and each pixel adjacent thereto, and for example, may be a pixel defining film. The bank BNK may be a pixel defining film or a dam structure that defines the light emitting area EA in which the light emitting elements LD are supplied in a process of supplying light emitting elements LD to the pixel PXL. For example, the light emitting area EA of the pixel PXL is partitioned by the bank BNK, so that a mixed solution (for example, ink) including a target amount and/or type of light emitting element LD may be supplied to (or injected into) the light emitting area EA.

The bank BNK may be configured to include at least one light blocking material and/or reflective material to reduce or prevent a light leakage defect in which light leaks between each pixel PXL and respective pixels adjacent thereto. In one or more embodiments, the bank BNK may include a transparent material (or substance). The transparent material may include, for example, a polyamides resin, a polyimide resin, and the like, but the present disclosure is not limited thereto. According to one or more other embodiments, a reflective material layer may be separately provided and/or formed on the bank BNK to further improve an efficiency of light emitted from each of the pixels PXL.

The bank BNK may include at least one or more openings OP exposing components located under the bank BNK in the pixel area PXA of the pixel PXL. The light emitting area EA of the pixel PXL may be defined by the opening OP of the bank BNK. The light emitting area EA of the pixel PXL may correspond to the opening OP of the bank BNK.

The opening OP of the bank BNK may be located in the second area A2 of the pixel area PXA. The opening OP may overlap the light emitting elements LD and may overlap electrodes for applying an electrical signal to the light emitting elements LD.

Hereinafter, the display element part DPL of the pixel PXL will be described.

The display element part DPL may include first to fourth alignment electrodes EL1 to EL4 located in the second area A2 of the pixel area PXA in which the pixel PXL is located, light emitting elements LD, first to fourth contact electrodes CEL1 to CEL4, first and second electrodes CNE1 and CNE2 (or first and second pixel electrodes), and a middle electrode CTE.

The first alignment electrode EL1, the second alignment electrode EL2, the third alignment electrode EL3, and the fourth alignment electrode EL4 may be provided and/or formed on the substrate SUB.

The first alignment electrode EL1, the second alignment electrode EL2, the third alignment electrode EL3, and the fourth alignment electrode EL4 may be sequentially arranged along the first direction DR1. The first alignment electrode EL1, the second alignment electrode EL2, the third alignment electrode EL3, and the fourth alignment electrode EL4 may extend in a direction that is different from the first direction DR1, for example, the second direction DR2 crossing the first direction DR1. The first to fourth alignment electrodes EL1 to EL4 may be separated from other electrodes (for example, electrodes provided in adjacent pixels PXL adjacent in the second direction DR2) after the light emitting elements LD are supplied and aligned in the pixel area PXA during the manufacturing process of the display device DD.

In the light emitting area EA of the pixel PXL, each of the first to fourth alignment electrodes EL1 to EL4 may be spaced apart from an adjacent electrode along the first direction DR1. For example, the first alignment electrode EL1 may be spaced apart from the second alignment electrode EL2, the second alignment electrode EL2 may be spaced apart from the third alignment electrode EL3, and the third alignment electrode EL3 may be spaced apart from the fourth alignment electrode EL4. A distance between the first alignment electrode EL1 and the second alignment electrode EL2, a distance between the second alignment electrode EL2 and the third alignment electrode EL3, and a distance between the third alignment electrode EL3 and the fourth alignment electrode EL4 may be approximately the same, but the present disclosure is not limited thereto. In one or more embodiments, the distance between the first alignment electrode EL1 and the second alignment electrode EL2, the distance between the second alignment electrode EL2 and the third alignment electrode EL3, and the distance between the third alignment electrode EL3 and the fourth alignment electrode EL4 may be different from each other.

In one or more embodiments, the first to fourth alignment electrodes EL1 to EL4 may be made of a conductive material (or substance) having a constant reflectivity. The conductive material (or substance) may include an opaque metal (or an opaque conductive material). The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In one or more embodiments, the first to fourth alignment electrodes EL1 to EL4 may include a transparent conductive material (or substance). The transparent conductive material (or substance) may include a conductive oxide such as an indium tin oxide (ITO), an indium zinc oxide (IZO), a zinc oxide (ZnOx), an indium gallium zinc oxide (IGZO), and an indium tin zinc oxide (ITZO), and a conductive polymer such as poly(3,4-ethylenedioxythiophene) (PEDOT). The zinc oxide (ZnOx) is a zinc oxide (ZnO) and/or a zinc peroxide (ZnO$_2$). When the first to fourth alignment electrodes EL1 to EL4 include a transparent conductive material (or substance), a separate conductive layer of made of an opaque metal for reflecting the light emitted from the light emitting elements LD in the image display direction of the display device may be added.

Each of the first to fourth alignment electrodes EL1 to EL4 may be provided and/or formed as a single film, but the present disclosure is not limited thereto. In one or more embodiments, each of the first to fourth alignment electrodes EU to EL4 may be provided and/or formed as a multi-layered film in which at least two or more of metals, alloys, conductive oxides, and conductive polymers are stacked. Each of the first to fourth alignment electrodes EL1 to EL4 may be formed of a multi-layered film of at least a double-layered film or more to reduce or minimize distortion caused by signal delay when transmitting a signal (or voltage) to respective end portions of each of the light emitting elements LD.

The first alignment electrode EL1 may partially extend to the first area A1 of the pixel PXL to overlap the second bridge pattern BRP2. For example, a portion of the first alignment electrode EL1 may be provided on the second bridge pattern BRP2 in the first area A1. The first alignment electrode EL1 may be electrically and/or physically connected to the second bridge pattern BRP2 through a contact hole.

A portion of the fourth alignment electrode EL4 may extend to the first area A1 of the pixel PXL to overlap the second power line PL2. For example, a portion of the fourth alignment electrode EL4 may be provided on the second power line PL2 in the first area A1. The fourth alignment electrode EL4 may be electrically and/or physically connected to the second power line PL2 through the contact hole CH.

Each of the first to fourth alignment electrodes EL1 to EL4 may receive an alignment signal (e.g., a predetermined alignment signal) before the light emitting elements LD are aligned in the light emitting area EA of the pixel PXL, so that it may receive an alignment signal (e.g., a predetermined alignment signal, or alignment voltage) from a corresponding pad electrode to be utilized as an alignment electrode (or alignment line) for aligning the light emitting elements LD.

The alignment signals (or alignment voltages) respectively transmitted to the first to fourth alignment electrodes EL1 to EL4 may be signals having a voltage difference and/or a phase difference at which the light emitting elements LD may be aligned between the first to fourth alignment electrodes EU to EL4. At least one of the alignment signals (or alignment voltages) respectively transmitted to the first to fourth alignment electrodes (EL1-EL4) may be an AC signal (or voltage), but the present disclosure is not limited thereto.

In the light emitting area EA of the pixel PXL, the first alignment electrode EL1 and the second alignment electrode EL2 together, along with a plurality of light emitting elements LD connected in parallel therebetween, may configure a first serial stage (see "SET1" in FIG. 4), and the third alignment electrode EL3 and the fourth alignment electrode EL4, together with a plurality of light emitting elements LD connected in parallel therebetween, may configure a second serial stage (see "SET2" in FIG. 4).

In one or more embodiments, the first and second serial stages SET1 and SET2 are located in the light emitting area EA of the pixel PXL, and the first and second serial stages SET1 and SET2 may configure the light emitting unit EMU of the corresponding pixel PXL.

The first alignment electrode EL1 included in the first serial stage SET1 may be an anode of the light emitting unit EMU, and the fourth alignment electrode EL4 included in the second serial stage SET2 may be a cathode of the light emitting unit EMU.

The light emitting elements LD may be an ultra-small light emitting diode using a material having an inorganic crystal structure, for example, having a size as small as nano-scale or micro-scale. Each of the light emitting elements LD may be an ultra-small light emitting diode manufactured by an etching method or a ultra-small light emitting diode manufactured by a growth method.

At least two to dozens of light emitting elements LD may be aligned and/or provided in the light emitting area EA of the pixel PXL, but the number of the light emitting elements LD is not limited thereto. In one or more embodiments, the number of light emitting elements LD aligned and/or provided in the light emitting area EA may be variously changed.

Each of the light emitting elements LD may emit color light and/or white light. In one or more embodiments, each of the light emitting elements LD may emit light of a first color. Here, the light of the first color may be blue light of a relatively short wavelength band.

Each of the light emitting elements LD may be aligned between two adjacent electrodes among the first to fourth alignment electrodes EL1 to EL4 so that an extension direction (or length (L) direction) is substantially parallel to the first direction DR1 when viewed in a plan view. The light emitting elements LD may be prepared in a form to be sprayed in a solution and then be placed in the pixel area PXA of each pixel PXL.

The light emitting elements LD may be injected in the pixel area PXA of each pixel PXL through an inkjet printing method, a slit coating method, or other methods. For example, the light emitting elements LD may be mixed with a volatile solvent to be supplied in the pixel area PXA through an inkjet printing method or a slit coating method. In this case, when a corresponding alignment signal is applied to each of the first to fourth alignment electrodes EL1 to EL4 provided in the pixel area PXA, an electric field may be formed between two adjacent electrodes among the first to fourth alignment electrodes EU to EL4. Accordingly, the light emitting elements LD may be aligned between two adjacent electrodes among the first to fourth alignment electrodes EL1 to EL4.

After the light emitting elements LD are arranged, the light emitting elements LD are finally arranged and/or provided in the pixel area PXA of each pixel PXL by volatilizing the solvent or by eliminating the solvent in another manner.

It is illustrated that the light emitting elements LD are aligned in a length (see "L" in FIG. 1) direction that is substantially parallel to the first direction DR1 between two adjacent electrodes among the first to fourth alignment electrodes EL1 to EL4, but the present disclosure is not limited thereto. In one or more embodiments, some of the light emitting elements LD may be aligned so that the length (L) direction thereof is substantially parallel to the second direction DR2 and/or to a direction inclined to the second direction DR2, between two adjacent electrodes. In addition, in some embodiments, at least one reverse direction light emitting element (refer to "LDr" in FIG. 4) connected in a reverse direction between two adjacent electrodes may be further located.

In one or more embodiments, the light emitting elements LD may include a plurality of first light emitting elements LD1 and a plurality of second light emitting elements LD2.

The first light emitting elements LD1 may be located between the first alignment electrode EL1 and the second alignment electrode EL2. The second light emitting elements LD2 may be located between the third alignment electrode EL3 and the fourth alignment electrode EL4.

The first light emitting elements LD1 may be aligned in the same direction between the first alignment electrode EL1 and the second alignment electrode EL2. For example, one end portion (for example, the first end portion EP1, see FIG. 2) of each of the first light emitting elements LD1 may be connected to the first alignment electrode EL1, and the other end portion thereof (for example, the second end portion EP2, see FIG. 2) may be connected to the second alignment electrode EL2. The first alignment electrode EL1 and the second alignment electrode EL2 together with the first light emitting elements LD1 connected in parallel and connected in the same direction therebetween may configure a first serial stage SET1.

The second light emitting elements LD2 may be aligned in the same direction between the third alignment electrode EL3 and the fourth alignment electrode EL4. For example, one end portion of each of the second light emitting elements LD2 may be connected to the third alignment electrode EL3, and the other end portion thereof may be connected to the fourth alignment electrode EL4. The third alignment electrode EL3 and the fourth alignment electrode EL4, together with the second light emitting elements LD2 connected in parallel and in the same direction therebetween, may configure a second serial stage SET2.

The first to fourth contact electrodes CEL1 to CEL4 may respectively overlap the first to fourth alignment electrodes EU to EL4. In addition, the first and second electrodes CNE1 and CNE2 and the middle electrode CTE may overlap the first to fourth contact electrodes CEL1 to CEL4. The middle electrode CTE may include the first middle electrode CTE1 and the second middle electrode CTE2. The first electrode CNE1, the first middle electrode CTE1, the second middle electrode CTE2, and the second electrode CNE2 are located to respectively overlap the first to fourth contact electrodes CEL1 to CEL4, and in some embodiments, the first electrode CNE1, the first middle electrode CTE1, the second middle electrode CTE2, and the second electrode CNE2 may completely overlap the first to fourth contact electrodes CEL1 to CEL4, respectively.

In a plan view, each of the first to fourth contact electrodes CEL1 to CEL4, the first and second electrodes CNE1 and CNE2, and the first and second middle electrodes CTE1 and CTE2 has a bar shape extending in the second direction DR2, and the first to fourth contact electrodes CEL1 to CEL4 may be spaced apart from each other in the first direction DR1, and the first and second electrodes CNE1 and CNE2 and the first and second middle electrodes CTE1 and CTE2 may be spaced apart from each other in the first direction DR1. However, the present disclosure is not limited thereto. In one or more embodiments, the shapes of the first to fourth contact electrodes CEL1 to CEL4, the first and second electrodes CNE1 and CNE2, and the first and second middle electrodes CTE1 and CTE2 may be variously changed within a range to be stably electrically connected to each of the light emitting elements LD. In addition, the shape of each of the first to fourth contact electrodes CEL1 to CEL4, the first and second electrodes CNE1 and CNE2, and the first and second middle electrodes CTE1 and CTE2 may be variously changed in consideration of a connection relationship with electrodes located therebelow and/or thereabove.

The first to fourth contact electrodes CEL1 to CEL4, the first and second electrodes CNE1 and CNE2, and the middle electrode CTE may have a structure for more reliably electrically connecting the first to fourth alignment electrodes EU EL4 and the light emitting elements LD.

For example, the first contact electrode CEL1 may overlap the first alignment electrode EL1, and may electrically connect the first alignment electrode EL1 and respective end portions (for example, the first end portion EP1, see FIG. 2) of each of the first light emitting elements LD1. The second contact electrode CEL2 may overlap the second alignment electrode EL2, and may electrically connect the second alignment electrode EL2 and respective end portions (for example, the second end portion EP2, see FIG. 2) of each of the first light emitting elements LD1. The third contact electrode CEL3 may overlap the third alignment electrode EL3, and may electrically connect the third alignment electrode EL3 and respective end portions (for example, the first end portion EP1, see FIG. 2) of each of the second light emitting elements LD2. The fourth contact electrode CEL4 may overlap the fourth alignment electrode EL4, and may electrically connect the fourth alignment electrode EL4 and respective end portions (for example, the second end portion EP2, see FIG. 2) of each of the second light emitting elements LD2.

For example, the first electrode CNE1 may overlap the first contact electrode CEL1 and/or the first alignment electrode EL1, and may electrically connect the first alignment electrode EU and respective end portions (for example, the first end portion EP1, refer to FIG. 2) of each of the first light emitting elements LD1 together with the first contact electrode CEL1. The first middle electrode CTE1 may overlap the second contact electrode CEL2 and/or the second alignment electrode EL2, and may electrically connect the second alignment electrode EL2 and opposite respective end portions (for example, the second end portion EP2, refer to FIG. 2) of each of the first light emitting elements LD1 together with the second contact electrode CEL2. The second middle electrode CTE2 may overlap the third contact electrode CEL3 and/or the third alignment electrode EL3, and may electrically connect the third alignment electrode EL3 and respective end portions (for example, the first end portion EP1, refer to FIG. 2) of each of the second light emitting elements LD2 together with the third contact electrode CEL3. The second electrode CNE2 may overlap the fourth contact electrode CEL4 and/or the fourth alignment electrode EL4, and may electrically connect the fourth alignment electrode EL4 and opposite respective end portions (for example, the second end portion EP2, refer to FIG. 2) of each of the second light emitting elements LD2 together with the fourth contact electrode CEL4.

More specific connection configurations between the first to fourth contact electrodes CEL1 to CEL4, the first and second electrodes CNE1 and CNE2, the middle electrode CTE, the first to fourth alignment electrodes EL1 to EL4, and the light emitting elements LD will be described later with reference to FIG. 6A and FIG. 6B.

The first middle electrode CTE1 and the second middle electrode CTE2 may be integrally connected to each other. The first middle electrode CTE1 and the second middle electrode CTE2 may be different areas of the middle electrode CTE. The first middle electrode CTE1 may have the same configuration as the first middle electrode CTE1 described with reference to FIG. 4, and the second middle electrode CTE2 may have the same configuration as the second middle electrode CTE2 described with reference to FIG. 4. The middle electrode CTE may function as a bridge electrode (or connection electrode) electrically connecting the other/opposite respective end portions of the first light emitting elements LD1 and the respective end portions of the second light emitting elements LD2. That is, the middle electrode CTE may be a bridge electrode (or connection electrode) connecting the first serial stage SET1 and the second serial stage SET2.

Figure 6A:
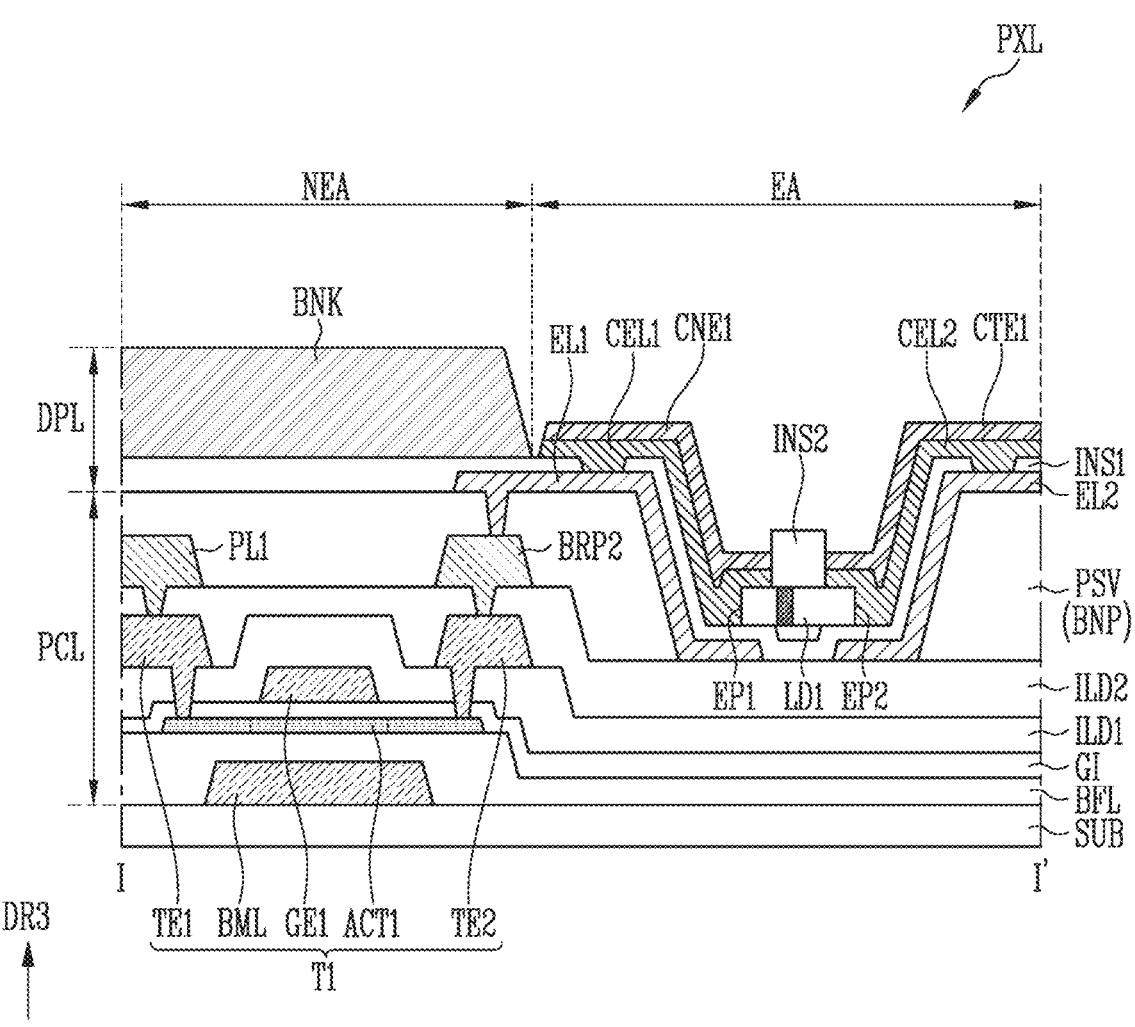
FIG. 6A and FIG. 6B illustrate cross-sectional views of a pixel taken along the line I-I' of FIG. 5.
Figure 6B:
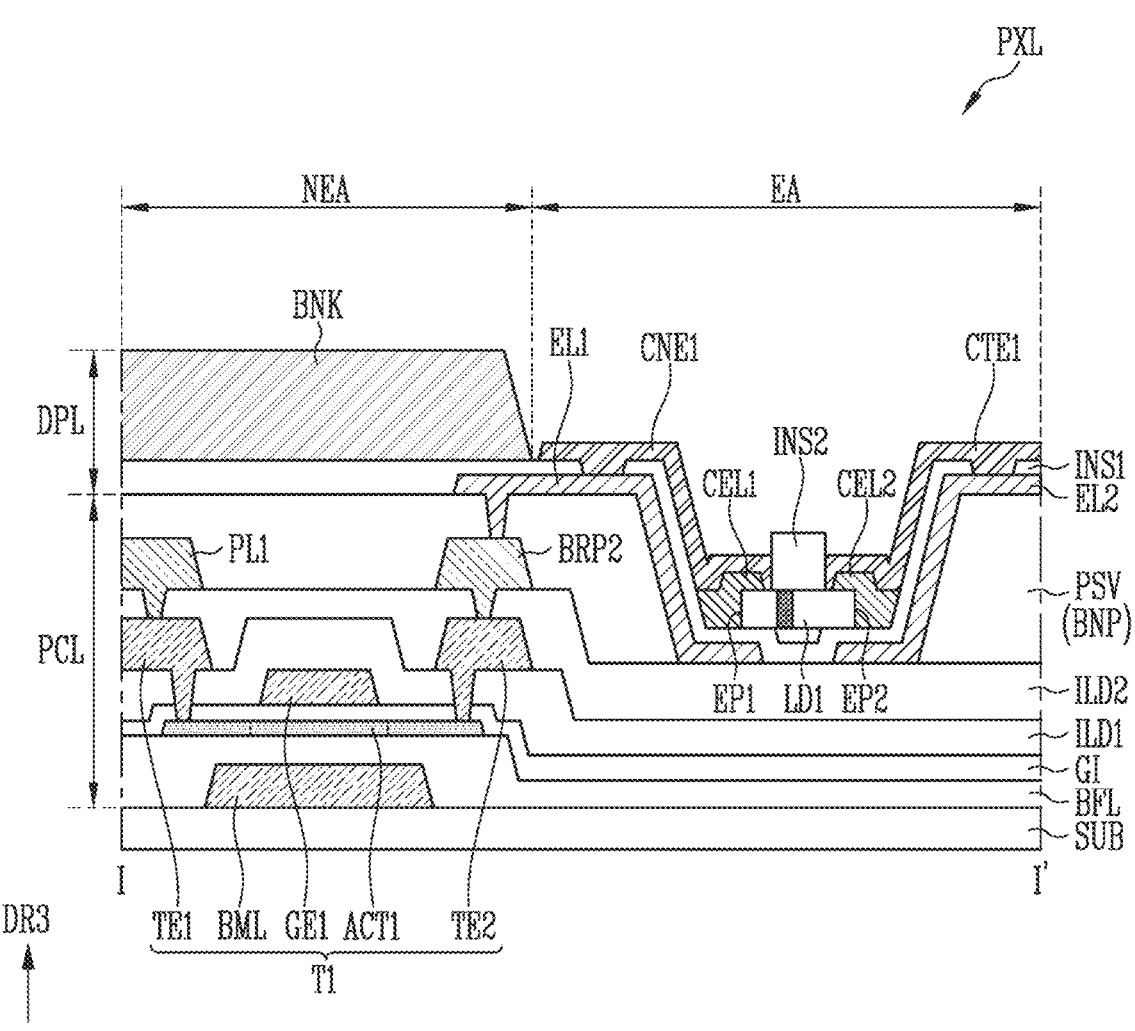

FIG. 6A and FIG. 6B illustrate cross-sectional views of a pixel taken along the line I-I' of FIG. 5. Because the first to third transistors T1 to T3 shown in FIG. 5 are substantially the same as or similar to each other, the first transistor T1 is shown in FIG. 6A and FIG. 6B as an example of the first to third transistors T1 to T3. In addition, because the first serial stage SET1 (see FIG. 4) and the second serial stage SET2 (see FIG. 4) are substantially the same as or similar to each other, a configuration corresponding to the first serial stage SET1 is shown in FIG. 6A and FIG. 6B as an example of the first serial stage SET1 and the second serial stage SET2.

In FIG. 6A and FIG. 6B, one pixel PXL is simplified by showing each electrode only as an electrode of a single film, and a plurality of insulation layers only as an insulation layer of a single film, but the present disclosure is not limited thereto.

Referring to FIG. 5, FIG. 6A, and FIG. 6B, the pixel PXL and the display device DD (see FIG. 3) including the same may include the pixel circuit part PCL (or pixel circuit layer) and the display element part DPL (or display element layer) located on one surface of the substrate SUB.

Circuit elements (for example, the first transistor T1) configuring the pixel circuit PXC (refer to FIG. 4) of the pixel PXL, and various wires connected thereto, may be located in the pixel circuit part PCL. In addition, in the display element part DPL, the first and second alignment electrodes EL1 and EL2 (and the third and fourth alignment electrodes EL3 and EL4), the first light emitting element LD1 (or light emitting elements LD), the first and second contact electrodes CEL1 and CEL2 (and the third and fourth contact electrodes CEL3 and CEL4), the first electrode CNE1 (and the second electrode CNE2), and the first middle electrode CTE1 (and the second middle electrode CTE2), which configure the light emitting unit EMU (refer to FIG. 4) of the pixel PXL, may be located.

The pixel circuit part PCL may include a plurality of insulation films (or insulation layers) in addition to the circuit elements and the wires. For example, the pixel circuit part PCL may include a buffer layer BFL, a gate insulating film GI, a first interlayer insulating film ILD1, a second interlayer insulating film ILD2, and/or a passivation film PSV, sequentially stacked on one surface of the substrate SUB.

Each of the plurality of insulation layers may be provided in a form including an organic insulation film, an inorganic insulation film, or an organic insulation film located on an inorganic insulation film. The inorganic insulation film may include, for example, at least one of metal oxides such as a silicon nitride (SiNx), a silicon oxide (SiOx), a silicon oxynitride (SiOxNy), and an aluminum oxide (AlOx). The organic insulation film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The bottom metal layer BML is located between the substrate SUB and the buffer layer BFL, and may overlap at least one of the first gate electrode GE1 and/or the first active pattern ACT1 of the first transistor T1.

The buffer layer BFL may be located on one surface of the substrate SUB on which the bottom metal layer BML is selectively formed. The buffer layer BFL may reduce or prevent impurities from diffusing into each circuit element.

A semiconductor layer may be located on the buffer layer BFL. The semiconductor layer may include the first active pattern ACT1 of the first transistor T1. The first active pattern ACT1 may include a channel area overlapping the first gate electrode GE1, and first and second conductive areas located at respective sides of the channel area (for example, the first source area SE1 (see FIG. 5) and the first drain area DE1 (see FIG. 5)).

The gate insulating film GI may be located on the semiconductor layer.

The first gate electrode GE1 of the first transistor T1 may be located on the gate insulating film GI.

The first interlayer insulating film ILD1 may be located on the first gate electrode GE1 of the first transistor T1.

The first and second transistor electrodes TE1 and TE2 of the first transistor T1 may be located on the first interlayer insulating film ILD1. Here, the first and second transistor electrodes TE1 and TE2 may be source and drain electrodes. The first transistor electrode TE1 may contact, or may be connected to, the first conductive area (for example, the first drain area DE1 (see FIG. 5)) of the first active pattern ACT1 through a contact hole penetrating the first interlayer insulating film ILD1 and the gate insulating film GI. The second transistor electrode TE2 may contact, or may be connected to, the second conductive area (for example, the first source area SE1 (see FIG. 5)) of the first active pattern ACT1 through a contact hole penetrating the first interlayer insulating film ILD1 and the gate insulating film GI.

A second interlayer insulating film ILD2 may be located on the first and second transistor electrodes TE1 and TE2.

The first power line PL1 and the second bridge pattern BRP2 may be located on the second interlayer insulating film ILD2.

The first power line PL1 may contact, or may be connected to, the first transistor electrode TE1 through a contact hole penetrating the second interlayer insulating film ILD2. The second bridge pattern BRP2 may contact, or may be connected to, the second transistor electrode TE2 through a contact hole penetrating the second interlayer insulating film ILD2.

The passivation film PSV may be located on the first power line PL1 and the second bridge pattern BRP2. In one or more embodiments, the passivation film PSV may include at least one organic insulation film, and may substantially flatten a surface of the pixel circuit part PCL.

In one or more embodiments, the passivation film PSV may flatten the surface of the pixel circuit part PCL in the non-light emitting area NEA, and may configure a wall pattern BNP (or, pattern, protrusion pattern) in the light emitting area EA. The wall pattern BNP is provided under the first and second alignment electrodes EL1 and EL2, and may protrude corresponding to one area of each of the first and second alignment electrodes EL1 and EL2 in the third direction DR3. Accordingly, a wall structure may be formed around the first light emitting element LD1. For example, a wall structure may be formed in the light emitting area EA so as to face the first and second end portions EP1 and EP2 of the first light emitting elements LD1. The wall pattern BNP may have various shapes. In one or more embodiments, the wall pattern BNP may have an inclined surface inclined at an angle of a corresponding range (e.g., a predetermined range) as shown in FIG. 6A and FIG. 6B. In one or more other embodiments, the wall pattern BNP may have a side surface of a curved shape, a cross-section of a semicircle (or semi-ellipse) shape, or a side surface of a step shape with respect to the substrate SUB. Conductive layers (or electrodes) and/or insulation films located on the wall pattern BNP may have a surface profile corresponding to the wall pattern BNP.

When the pixel circuit PXC (refer to FIG. 4) is located only in the non-light emitting area NEA, planarization of the light emitting area EA may not be necessary. In the case of flattening the non-light emitting area NEA and concurrently or substantially simultaneously forming the wall pattern BNP, a manufacturing process may be simplified.

However, the passivation film PSV is not limited thereto. For example, the passivation film PSV may planarize all of the non-light emitting area NEA and the light emitting area EA, and the wall pattern BNP separate from the passivation film PSV may be formed in the light emitting area EA.

The display element part DPL may be located on the passivation film PSV.

The display element part DPL may include the first and second alignment electrodes EL1 and EL2, a first insulation film INS1 (or first insulation layer, first insulation pattern), the first light emitting element LD1, the first and second contact electrodes CEL1 and CEL2, the first electrode CNE1, the first middle electrode CTE1, and a second insulation film INS2 (or second insulation layer, second insulation pattern).

The first and second alignment electrodes EU and EL2 may be located on the wall pattern BNP. The first and second alignment electrodes EL1 and EL2 may be located apart from each other in the light emitting area EA.

In one or more embodiments, each of the first and second alignment electrodes EL1 and EL2 may have a multi-film structure including a plurality of electrode layers (or conductive layers). For example, each of the first and second alignment electrodes EL1 and EL2 may include the first electrode layer (or the first conductive layer) and the second electrode layer (or the second conductive layer). One of the first and second electrode layers may have a relatively high reflectance, and the other of the first and second electrode layers may have relatively high electrical conductivity. That is, one of the first electrode layer and the second electrode layer may be made of a material having a constant reflectance so that light emitted from the first light emitting element LD1 proceeds to the third direction DR3 (or the image display direction of the display device), and the other of the first electrode layer and the second electrode layer may include a low-resistance material to reduce resistance (or contact resistance). For example, the first electrode layer may have a relatively large reflectance, and may include silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. For example, the second electrode layer may have a relatively high electrical conductivity, and may include a metal such as molybdenum (Mo), titanium (Ti), copper (Cu), aluminum (Al), silver (Ag), and an alloy thereof.

The first insulation film INS1 may be located on the first and second alignment electrodes EL1 and EL2.

The first insulation film INS1 may be provided and/or formed on the pixel circuit part PCL (or a layer corresponding thereto) to entirely cover the first and second alignment electrodes EL1 and EL2. After the first light emitting element LD1 (or light emitting elements LD) is supplied and aligned on the first insulation layer INS1, the first insulation layer INS1 may be partially opened to expose an area of each of the first and second alignment electrodes EL1 and EL2. The first insulation film INS1 may be patterned in a form of an individual pattern that is locally located under the first light emitting element LD1 after supply and alignment of the first light emitting element LD1. The first insulation film INS1 may also be located in the non-light emitting area NEA. In one or more embodiments, the first insulation film INS1 may be omitted.

The bank BNK may be located on one surface of the substrate SUB including the first insulation film INS1. For example, the bank BNK may be provided in the non-light emitting area NEA to surround the light emitting area EA.

The bank BNK may include an insulation material including at least one inorganic material and/or an organic material. For example, the bank BNK may include at least one layer of inorganic film that includes various inorganic insulation materials including a silicon nitride (SiNx), a silicon oxide (SiOx), or a silicon oxynitride (SiOxNy). Alternatively, the bank BNK may include at least one layer of organic film including various types of organic insulation materials including a photo resist material, or may be configured of a single-layered or multi-layered insulator including organic/inorganic materials in combination.

In one or more embodiments, the bank BNK includes a light blocking material or a color filter material, so that light leakage between adjacent pixels PXL may be blocked or reduced.

The first light emitting element LD1 may be located on the first insulation film INS1.

The first light emitting element LD1 (or light emitting elements LD) may be supplied and aligned in the light emitting area EA. In one or more embodiments, a plurality of light emitting elements LD may be supplied to the light emitting area EA of the pixel PXL through an inkjet method, a slit coating method, or other various methods, and as an alignment signal (e.g., a predetermined alignment signal, or alignment voltage) is applied to each of the first and second alignment electrodes EL1 and EL2 (or, alignment wires before being separated into the first and second alignment electrodes EL1 and EL2), the first light emitting element LD1 may be aligned between the first and second alignment electrodes EU and EL2 (or the wall patterns BNP).

The first and second contact electrodes CEL1 and CEL2 may be located on the first and second alignment electrodes EL1 and EL2 and the first light emitting element LD1.

As shown in FIG. 6A, the first contact electrode CEL1 may be provided and/or formed on the first end portion EP1 of the first light emitting element LD1. The first contact electrode CEL1 may directly contact the first end portion EP1 of the first light emitting element LD1 to be electrically and/or physically connected to the first end portion EP1 of the first light emitting element LD1. In addition, the first contact electrode CEL1 may be provided and/or formed on the first alignment electrode EL1. The first contact electrode CEL1 may directly contact the first alignment electrode EL1 to be electrically and/or physically connected to the first alignment electrode EL1. Accordingly, the first alignment electrode EL1 and the first end portion EP1 of each of the first light emitting elements LD1 may be electrically connected to each other through the first contact electrode CEL1.

However, the first contact electrode CEL1 is not limited thereto. For example, as shown in FIG. 6B, the first contact electrode CEL1 may cover only the first end portion EP1 of the first light emitting element LD1, and may directly contact only the first end portion EP1 of the first light emitting element LD1 (e.g., while not directly contacting the first alignment electrode EL1). The first contact electrode CEL1 may be electrically connected to the first alignment electrode EL1 through the first electrode CNE1.

Similar to the first contact electrode CEL1, the second contact electrode CEL2 may be provided and/or formed on the second end portion EP2 of the first light emitting element LD1. As shown in FIG. 6A, the second contact electrode CEL2 may directly contact the second end portion EP2 of the first light emitting element LD1. In addition, the second contact electrode CEL2 may be provided and/or formed on the second alignment electrode EL2. The second contact electrode CEL2 may directly contact the second alignment electrode EL2. Accordingly, the second alignment electrode EL2 and the second end portion EP2 of the first light emitting element LD1 may be electrically connected to each other through the second contact electrode CEL2.

However, the second contact electrode CEL2 is not limited thereto. For example, as shown in FIG. 6B, the second contact electrode CEL2 may cover only the second end portion EP2 of the first light emitting element LD1, and may directly contact only the second end portion EP2 of the first light emitting element LD1 (e.g., while not directly contacting the second alignment electrode EL2). The second contact electrode CEL2 may be electrically connected to the second alignment electrode EL2 through the first middle electrode CTE1.

In one or more embodiments, the first and second contact electrodes CEL1 and CEL2 (and the third and fourth contact electrodes CEL3 and CEL4) may be formed through chemical vapor deposition (CVD). For reference, a physical vapor deposition (PVD) (for example, sputtering deposition) technology may form a thin film with metal or an alloy and may precisely control a thickness of the film, so that the physical vapor deposition is generally used in electrode formation. However, in the case of the electrode formed through the physical vapor deposition, it has a relatively low step coverage characteristic, and thus, for example, a contact between the first and second contact electrodes CEL1 and CEL2 and the first light emitting element LD1 may be defective. Here, the step coverage may be defined as a ratio between a thickness of a thin film deposited on a side surface of a lower element (for example, the first light emitting element LD1) and a thickness of a thin film deposited on an upper surface of the lower element. The higher or better the step coverage, the more uniform the thicknesses of the thin films on the side and upper surfaces of the lower element. Conversely, the lower or worse the step coverage, the more likely a defect may occur in a thin portion (for example, a portion of the thin film deposited on the side surface of the lower element) of the thickness of the thin film. In the case of the chemical vapor deposition, a reactant gas causes a chemical reaction on the surface of the lower element, and the reactants generated through the chemical reaction move along the surface of the lower element by concentration difference diffusion, thus the thin film formed through the chemical vapor deposition may have a relatively high step coverage characteristic.

When the first and second contact electrodes CEL1 and CEL2 respectively cover the first and second end portions EP1 and EP2 of the first light emitting element LD1, in the first and second end portions EP1 and EP2 (that is, the side surfaces) of the first light emitting element LD1, the thicknesses of the first and second contact electrodes CEL1 and CEL2 are relatively uniform, and contact defects may be reduced or prevented. As will be described later with reference to FIG. 8, even if the surfaces of the first and second end portions EP1 and EP2 (that is, the side surfaces) of the first light emitting element LD1 are uneven, the first and second contact electrodes CEL1 and CEL2 formed through the chemical vapor deposition may entirely contact the first and second end portions EP1 and EP2 of the first light emitting element LD1. That is, a side contact area of the first light emitting element LD1 with respect to the first and second contact electrodes CEL1 and CEL2 may be sufficiently secured, and accordingly, an increase in contact resistance or defective contact between the first light emitting element LD1 and the first and second contact electrodes CEL1 and CEL2 may be reduced or prevented.

To form the first and second contact electrodes CEL1 and CEL2 (and the third and fourth contact electrodes CEL3 and CEL4) through the chemical vapor deposition, the first and second contact electrodes CEL1 and CEL2 (and the third and fourth contact electrodes CEL3 and CEL4) may include a material that may be formed by the chemical vapor deposition.

In one or more embodiments, the first and second contact electrodes CEL1 and CEL2 (and the third and fourth contact electrodes CEL3 and CEL4) may include a doped semiconductor material. For example, the first and second contact electrodes CEL1 and CEL2 (and the third and fourth contact electrodes CEL3 and CEL4) may include an N-type semiconductor material doped with a first conductive type of dopant or a P-type semiconductor material doped with a second conductive type of dopant.

For example, when silane $SiH_4$ and hydrogen $H_2$ are used as the reaction gas, the first and second contact electrodes CEL1 and CEL2 (and the third and fourth contact electrodes CEL3 and CEL4) may include an amorphous silicon (a-Si). Then, an n-type impurity or p-type impurity may be doped into the amorphous silicon through an implantation process.

As another example, when silane $SiH_4$, hydrogen $H_2$, and diborane $B_2H_6$ are used as the reaction gas, the first and second contact electrodes CEL1 and CEL2 (and the third and fourth contact electrodes CEL3 and CEL4) may include a P-type amorphous silicon (that is, p+a-Si).

As another example, when silane $SiH_4$, hydrogen $H_2$, and phospin $PH_3$ are used as the reaction gas, the first and second contact electrodes CEL1 and CEL2 (and the third and fourth contact electrodes CEL3 and CEL4) may include an N-type amorphous silicon (that is, n+a-Si). Contact resistance of an n-type amorphous silicon in which electrons are majority carriers may be lower than that of a p-type amorphous silicon in which holes are majority carriers. Accordingly, the first and second contact electrodes CEL1 and CEL2 (and the third and fourth contact electrodes CEL3 and CEL4) may include an N-type amorphous silicon.

The first electrode CNE1 and the first middle electrode CTE1 may be provided and/or formed on the first and second contact electrodes CEL1 and CEL2.

As shown in FIG. 6A, the first electrode CNE1 may be provided and/or formed on the first alignment electrode EU and/or the first contact electrode CEL1. The first electrode CNE1 may completely overlap the first contact electrode CEL1 in a plan view. In one or more other embodiments, as shown in FIG. 6B, the first electrode CNE1 may cover the first contact electrode CEL1. The first electrode CNE1 may directly contact the first alignment electrode EL1, and may be electrically and/or physically connected to the first alignment electrode EL1. In addition, the first electrode CNE1 may be provided and/or formed on the first end portion EP1 of the first light emitting element LD1, and may be electrically connected to the first end portion EP1 of the first light emitting element LD1 through the first contact electrode CEL1. Accordingly, the first alignment electrode EU and the first end portion EP1 of the first light emitting element LD1 may be electrically connected to each other through the first electrode CNE1 and the first contact electrode CEL1.

As shown in FIG. 6A, the first middle electrode CTE1 may be provided and/or formed on the second alignment electrode EL2 and/or the second contact electrode CEL2. The first middle electrode CTE1 may completely overlap the second contact electrode CEL2 in a plan view. In one or more other embodiments, as shown in FIG. 6B, the first middle electrode CTE1 may cover the second contact electrode CEL2. The first middle electrode CTE1 may directly contact the second alignment electrode EL2, and may be electrically and/or physically connected to the second alignment electrode EL2. In addition, the first middle electrode CTE1 may be provided and/or formed on the second end portion EP2 of the first light emitting element LD1, and may be electrically connected to the second end portion EP2 of the first light emitting element LD1 through the second contact electrode CEL2. Accordingly, the second alignment electrode EL2 and the second end portion EP2 of the first light emitting element LD1 may be electrically connected to each other through the first middle electrode CTE1 and the second contact electrode CEL2.

The first electrode CNE1 (and the second electrode CNE2) and the first middle electrode CTE1 (and the second middle electrode CTE2) may be made of various transparent conductive materials so that light emitted from the first light emitting element LD1 (or the light emitting elements LD) proceeds in the image display direction (for example, the third direction DR3) of the display device without loss. For example, the first electrode CNE1 and the first middle electrode CTE1 may at least one of various transparent conductive materials (or substances) such as an indium tin oxide (ITO), an indium zinc oxide (IZO), a zinc oxide $(ZnO_x)$, an indium gallium zinc oxide (IGZO), and an indium tin zinc oxide (ITZO), and may be formed to be substantially transparent or translucent to satisfy a light transmittance (e.g., a predetermined light transmittance, or transmittance). However, the materials of the first electrode CNE1 and the first middle electrode CTE1 are not limited to the above-described embodiments. In one or more embodiments, the first electrode CNE1 and the first middle electrode CTE1 may be made of various opaque conductive materials (or substances). The first electrode CNE1 and the first middle electrode CTE1 may be formed as a single film or a multi-film.

The second insulation film INS2 (or second insulation pattern) may be provided and/or formed on the first light emitting element LD1 between the first electrode CNE1 and the first middle electrode CTE1. The second insulation film INS2 is located on the first light emitting element LD1, and may expose the first end portion EP1 and the second end portion EP2 of the first light emitting element LD1.

The second insulation film INS2 may reduce or prevent the likelihood of a short between the first electrode CNE1 (and the first contact electrode CEL1) and the first middle electrode CTE1 (and the second contact electrode CEL2). In addition, during the manufacturing process of the display device DD (see FIG. 3), the second insulation film INS2 may reduce or prevent the likelihood of the first light emitting element LD1 being separated from the first insulation film INS1.

In one or more embodiments, a color converting layer may be provided and/or formed on the first electrode CNE1 and the first middle electrode CTE1.

The color converting layer may include color converting particles corresponding to a specific color. The color converting layer may include color converting particles that convert light of a first color emitted from the first light emitting element LD1 (or light emitting elements LD) located in the pixel PXL into light of a second color (or a specific color). For example, when the pixel PXL is a red pixel, the color converting layer may include color converting particles of red quantum dots that convert light emitted from the first light emitting element LD1 into red light. As another example, when the pixel PXL is a green pixel, the color converting layer may include color converting particles of green quantum dots that convert light emitted from the first light emitting element LD1 into green light. As another example, when the pixel PXL is a blue pixel, the color converting layer may include color converting particles of blue quantum dots that convert light emitted from the first light emitting element LD1 into blue light.

In one or more embodiments, the display element part DPL may further include a color filter. The color filter may be provided in the light emitting area EA of the pixel PXL.

The color filter may selectively transmit light (that is, light converted into a specific color) emitted from the color converting layer. The color filter may include a red color filter, a green color filter, and a blue color filter.

As described above, the first and second contact electrodes CEL1 and CEL2 (and the third and fourth contact electrodes CEL3 and CEL4) contacting the first and second end portions EP1 and EP2 of the first light emitting element LD1 (or the light emitting elements LD) may be provided or formed. The first and second contact electrodes CEL1 and CEL2 may be formed through chemical vapor deposition, and may have a relatively high step coverage characteristic. Accordingly, a side contact area of the first light emitting element LD1 with respect to the first and second contact electrodes CEL1 and CEL2 may be sufficiently secured, and accordingly, an increase in contact resistance or defective contact between the first light emitting element LD1 and the first and second contact electrodes CEL1 and CEL2 may be reduced or prevented.

Figure 7A:
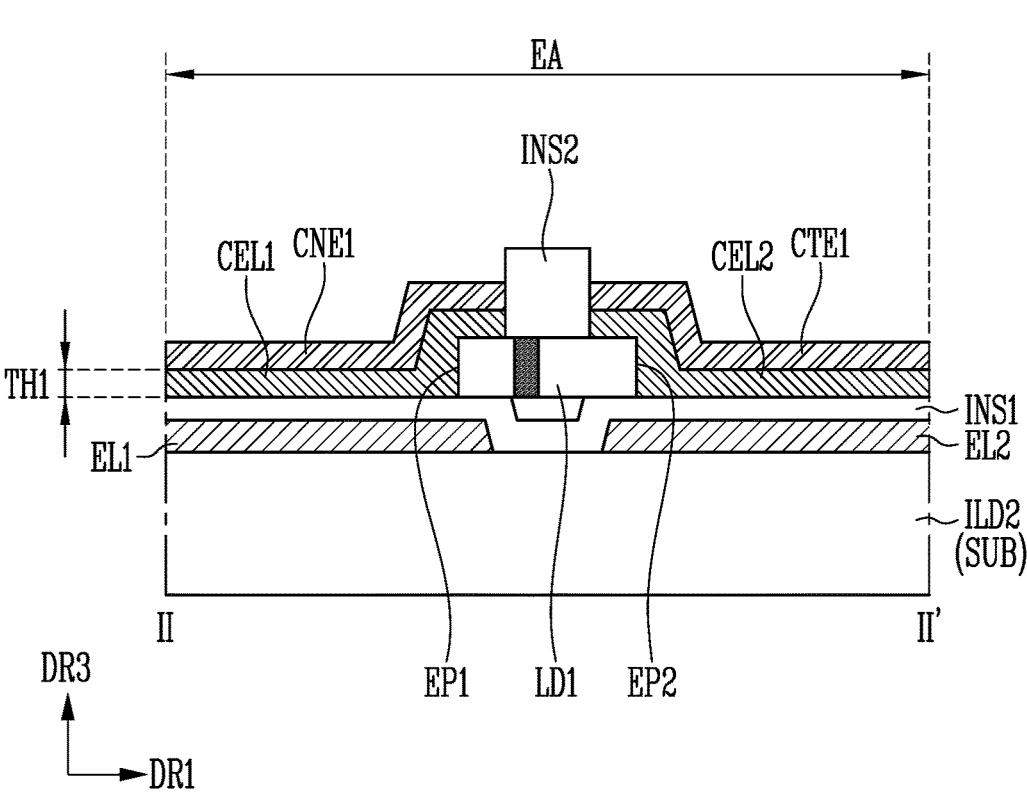
FIG. 7A to FIG. 7C illustrate cross-sectional views of various embodiments of a pixel taken along the line II-II' of FIG. 5.
Figure 7B:
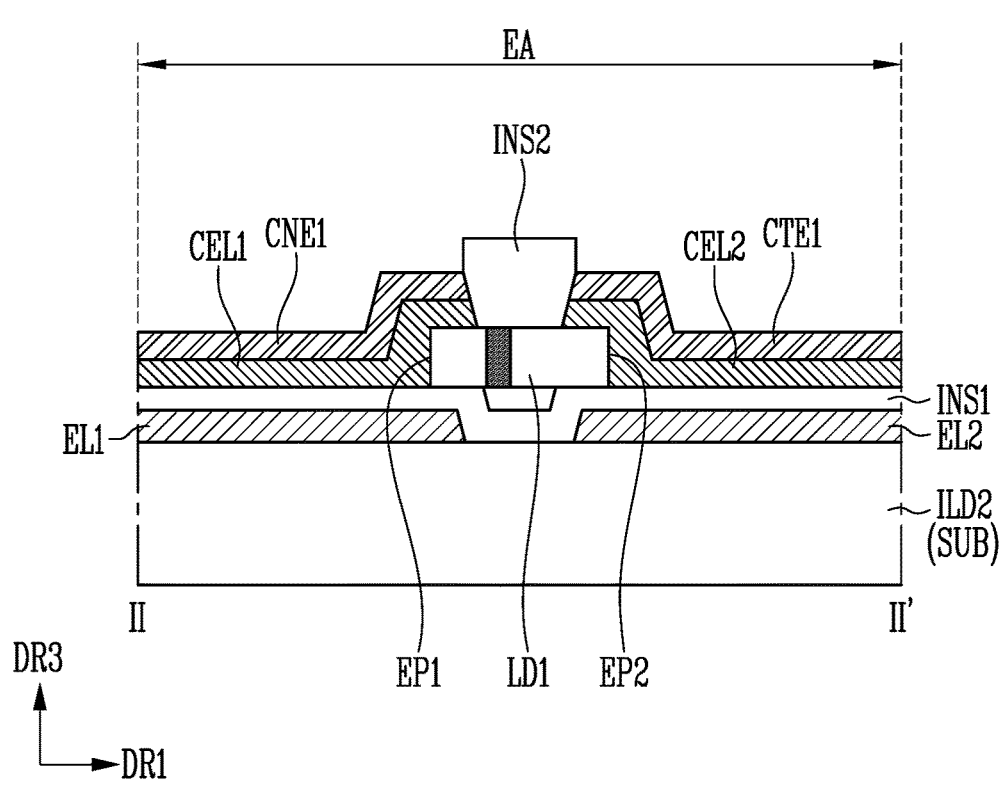
Figure 7C:
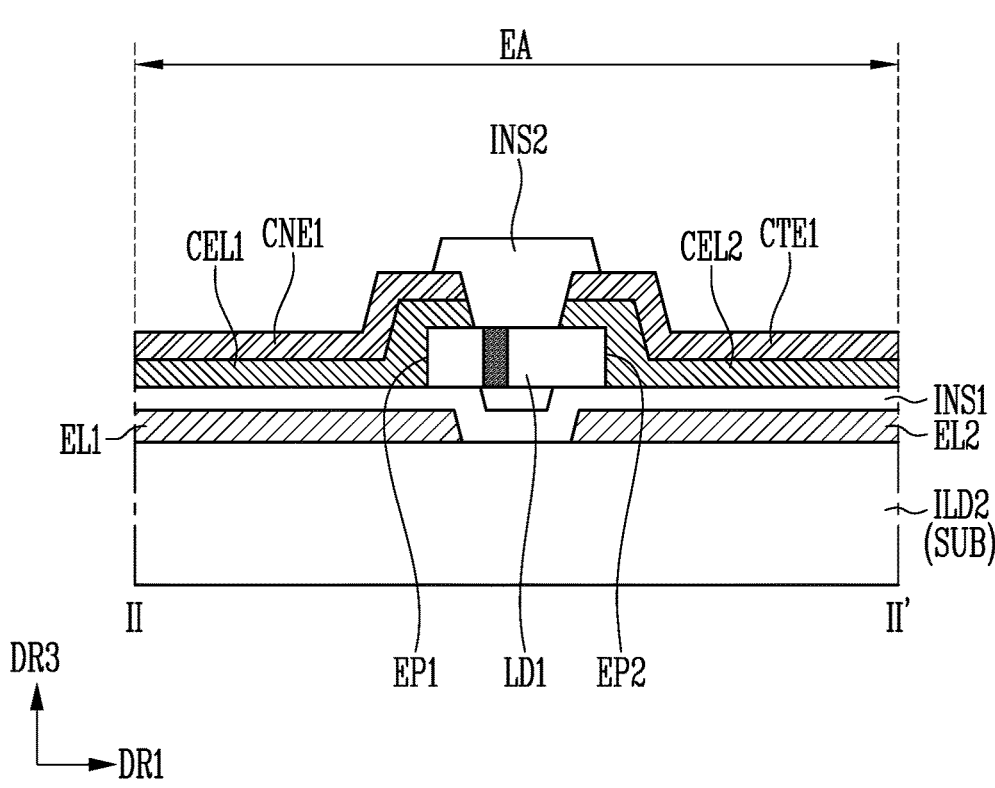

FIG. 7A to FIG. 7C illustrate cross-sectional views of various embodiments of a pixel taken along the line II-II' of FIG. 5. FIG. 7A to FIG. 7C illustrate cross-sectional views corresponding to the light emitting area EA of FIG. 6A, and briefly illustrate the pixel PXL based on the display element part DPL (refer to FIG. 6A).

Referring to FIG. 6A and FIG. 7A to FIG. 7C, the first and second alignment electrodes EL1 and EL2, the first light emitting element LD1, the first and second contact electrodes CEL1 and CEL2, the first electrode CNE1, and the first middle electrode CTE1, which are shown in FIG. 7A to FIG. 7C, are respectively substantially the same as, or similar to, the first and second contact electrodes CEL1 and CEL2, the first electrode CNE1, and the first middle electrode CTE1, which are shown in FIG. 6A, so duplicate descriptions thereof will be omitted.

The first and second contact electrodes CEL1 and CEL2 may be located on the same layer through the same process, and an end portion of each of the first and second contact electrodes CEL1 and CEL2 may be in contact with a side surface of the second insulation film INS2. Similarly, the first electrode CNE1 and the first middle electrode CTE1 may be located on the same layer through the same process, and an end portion of each of the first electrode CNE1 and the first middle electrode CTE1 may be in contact with a side surface of the second insulation film INS2.

A profile (or an etch profile or an etching profile, for example, an inclination angle of a side surface based on the second interlayer insulating film ILD2 or the substrate SUB) of an end portion of the first contact electrode CEL1 may be substantially the same as a profile of an end portion of the first electrode CNE1. Similarly, a profile of an end portion of the second contact electrode CEL2 may be substantially the same as a profile of an end portion of the first middle electrode CTE1.

As will be described with reference to FIG. 12A to FIG. 12D, the first and second contact electrodes CEL1 and CEL2, the first electrode CNE1, and the first middle electrode CTE1 may be concurrently or substantially simultaneously formed through the same etching process (for example, an etching process using the same mask), and accordingly, the first and second contact electrodes CEL1 and CEL2, the first electrode CNE1, and the first middle electrode CTE1 may have the same profile (or side inclination angle). That is, by concurrently or substantially simultaneously forming the first and second contact electrodes CEL1 and CEL2 with the first electrode CNE1 and the first middle electrode CTE1 (e.g., respectively), the etching process for the first and second contact electrodes CEL1 and CEL2 is not separately required, and thus the manufacturing process may be relatively simplified.

In one or more embodiments, as shown in FIG. 7B and FIG. 7C, the second insulation film INS2 may have a reverse tapered cross-sectional shape. As will be described with reference to FIG. 12A to FIG. 12D, after the first and second contact electrodes CEL1 and CEL2, the first electrode CNE1, and the first middle electrode CTE1 are formed through an etching process, the second insulation film INS2 may be formed, and accordingly, the second insulation film INS2 may have a reverse tapered cross-sectional shape. In one or more embodiments, as shown in FIG. 7C, the second insulation film INS2 may be partially located on the first electrode CNE1 and the first middle electrode CTE1.

In one or more embodiments, a thickness TH1 (see FIG. 7A) of each of the first and second contact electrodes CEL1 and CEL2 in the third direction DR3 may be about 1000 Å or less, about 500 Å or less, or about 400 Å or less. For reference, refractive indexes of the first and second contact electrodes CEL1 and CEL2 may be greater than refractive indexes of other constituent elements. For example, as described with reference to FIG. 6A and FIG. 6B, the first and second contact electrodes CEL1 and CEL2 may include an amorphous silicon doped with an N-type or p-type impurity, and the first insulation film INS1 may include a silicon oxide (SiOx), and the first electrode CNE1 and the first middle electrode CTE1 may include an indium tin oxide (ITO). In this case, the refractive indexes of the first and second contact electrodes CEL1 and CEL2 may be greater than the refractive index of the first insulation film INS1 or the refractive index of the first electrode CNE1. As thicknesses of the first and second contact electrodes CEL1 and CEL2 having a relatively large refractive index increase, an amount of light emitted in the third direction DR3 may decrease. For example, the thickness TH1 of each of the first and second contact electrodes CEL1 and CEL2 may be less than or equal to about 500 Å to ensure light output efficiency of the pixel PXL to be greater than or equal to reference efficiency.

As described above, the first and second contact electrodes CEL1 and CEL2, the first electrode CNE1, and the first middle electrode CTE1 may be concurrently or substantially simultaneously formed through the same etching process or respective etching processes, and thus the manufacturing process may be relatively simplified. In addition, when the thickness TH1 of each of the first and second contact electrodes CEL1 and CEL2 is about 500 Å or less, the light output efficiency of the pixel PXL may be greater than or equal to the reference efficiency.

Figure 8:
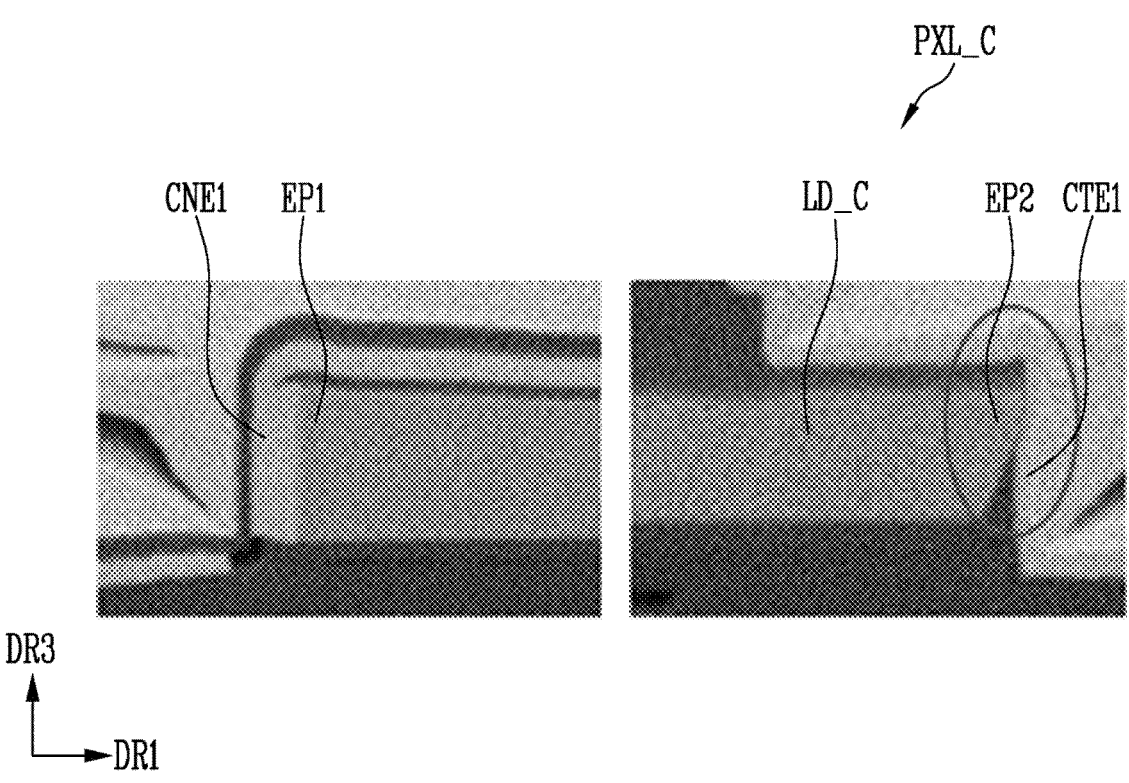
FIG. 8 illustrates a pixel according to a comparative example.

FIG. 8 illustrates a pixel according to a comparative example. FIG. 8 illustrates a pixel PXL_C according to a comparative example that does not include the first and second contact electrodes CEL1 and CEL2, for example, and briefly illustrates the pixel PXL_C based on a light emitting element LD_C, a first electrode CNE1, and a first middle electrode CTE1.

Referring to FIG. 8, a surface of a second end portion EP2 of the light emitting element LD_C may be uneven. For reference, the first semiconductor layer SCL1, the active layer ACT, and the second semiconductor layer SCL2, which are described with reference to FIG. 2, are sequentially stacked on a wafer to manufacture the light emitting element LD_C, and the light emitting element LD_C may be separated from the wafer through a separation process. The second end portion EP2 of the light emitting element LD_C is a portion separated from the wafer, and the surface of the second end portion EP2 of the light emitting element LD_C may be uneven. As shown in FIG. 8, the second end portion EP2 of the light emitting element LD_C may have a reverse tapered cross-sectional shape. In this case, the first middle electrode CTE1 (for example, the first middle electrode CTE1 formed through sputtering deposition) may not properly contact the second end portion EP2 of the light emitting element LD_C. That is, a contact area between the second end portion EP2 of the light emitting element LD_C and the first middle electrode CTE1 may be decreased, a contact resistance between the second end portion EP2 of the light emitting element LD_C and the first middle electrode CTE1 may be increased, and the light emitting element LD_C may abnormally emit light or may not emit light.

Accordingly, the display device DD (see FIG. 3) and the pixel PXL according to one or more embodiments of the present disclosure may further include the second contact electrode CEL2 (see FIG. 7A) located between the second end portion EP2 of the first light emitting element LD1 and the first middle electrode CTE1, and the second contact electrode CEL2 may be formed through chemical vapor deposition to have a relatively high step coverage characteristic. Accordingly, an increase in contact resistance or defective contact between the second end portion EP2 of the first light emitting element LD1 and the second contact electrode CEL2 may be reduced or prevented.

A first end portion EP1 of the light emitting element LD_C is a portion that is spaced apart from the wafer, and the first end portion EP1 of the light emitting element LD_C may have a relatively even surface. In this case, the first electrode CNE1 may relatively normally contact the first end portion EP1 of the light emitting element LD_C. However, when the first electrode CNE1 is formed through sputtering deposition, the step coverage characteristic of the first electrode CNE1 is relatively low, in other words, the thickness in the first direction DR1 of the first electrode CNE1 deposited on the first end portion EP1 (or the side surface) of the light emitting element LD_C may be relatively thin. Accordingly, defective contact may occur even at the first end portion EP1 of the light emitting element LD_C.

Accordingly, the display device DD (see FIG. 3) and the pixel PXL according to one or more embodiments of the present disclosure may further include the first contact electrode CEL1 located between the first end portion EP1 of the first light emitting element LD1 and the first electrode CNE1, and the first contact electrode CEL1 may be formed through chemical vapor deposition to have a relatively high step coverage characteristic. Accordingly, an increase in contact resistance or defective contact between the first end portion EP1 of the first light emitting element LD1 and the first contact electrode CEL1 may be reduced or prevented.

Figure 9A:
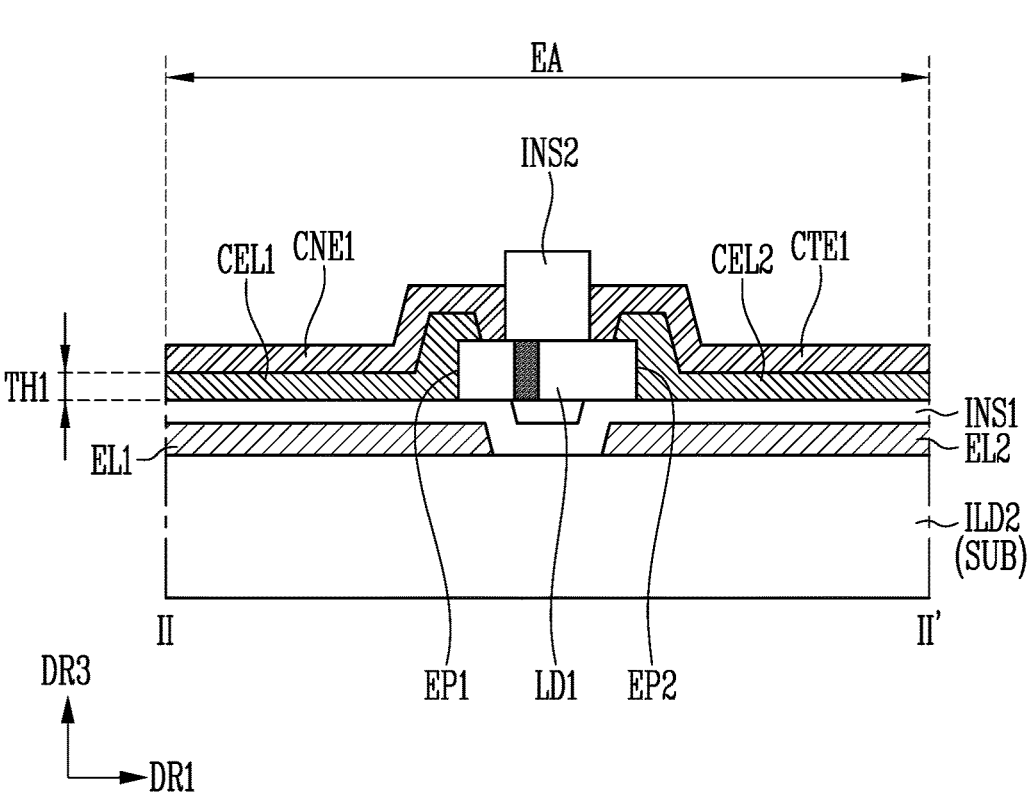
FIG. 9A and FIG. 9B illustrate cross-sectional views of various embodiments of a pixel taken along the line II-II' of FIG. 5.
Figure 9B:
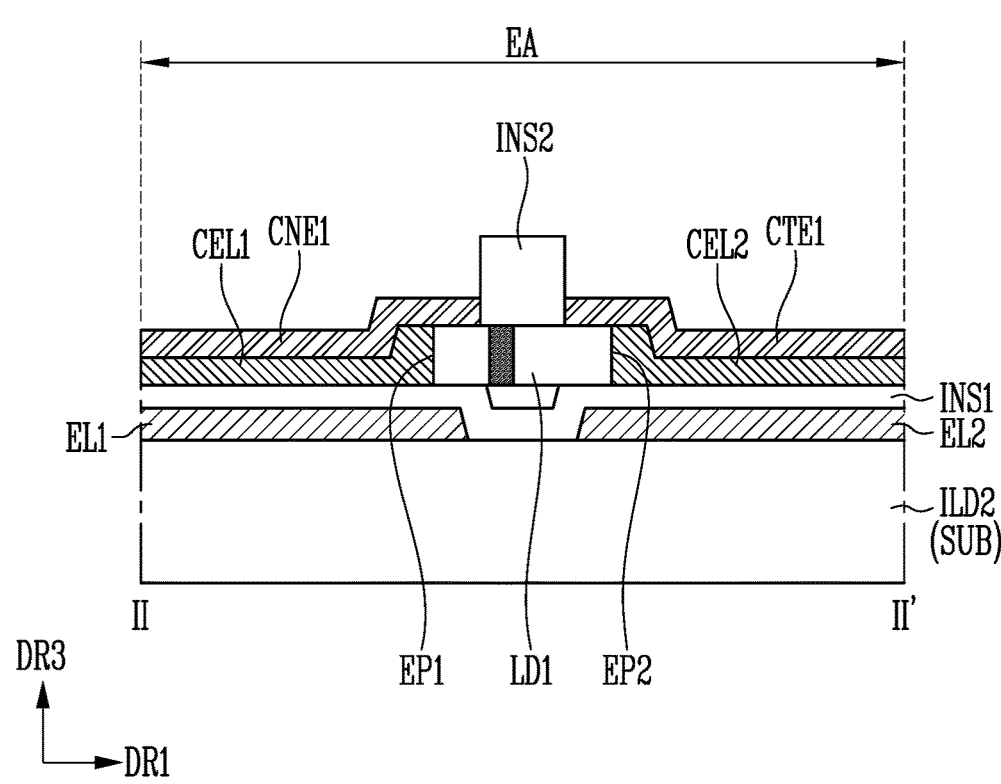

FIG. 9A and FIG. 9B illustrate cross-sectional views of various embodiments of a pixel taken along the line II-II' of FIG. 5. FIG. 9A and FIG. 9B illustrate cross-sectional views corresponding to the light emitting area EA of FIG. 6B, and briefly illustrate the pixel PXL based on the display element part DPL (refer to FIG. 6B).

Referring to FIG. 6B, FIG. 9A, and FIG. 9B, the first and second alignment electrodes EL1 and EL2, the first light emitting element LD1, the first and second contact electrodes CEL1 and CEL2, the first electrode CNE1, and the first middle electrode CTE1, which are shown in FIG. 9A and FIG. 9B, are respectively substantially the same as, or similar to, the first and second contact electrodes CEL1 and CEL2, the first electrode CNE1, and the first middle electrode CTE1, which are shown in FIG. 6B, so duplicate descriptions thereof will be omitted.

The end portions of each of the first and second contact electrodes CEL1 and CEL2 may be spaced apart from the second insulation film INS2 (or a side surface of the second insulation film INS2). The first electrode CNE1 may cover the first contact electrode CEL1, and the first middle electrode CTE1 may cover the second contact electrode CEL2. The end portions of each of the first electrode CNE1 and the first middle electrode CTE1 may be in contact with the side surface of the second insulation film INS2.

As will be described with reference to FIG. 13A to FIG. 13C, the first and second contact electrodes CEL1 and CEL2 may be formed through etching processes that are different from those of the first electrode CNE1 and the first middle electrode CTE1.

As shown in FIG. 9A, the first and second contact electrodes CEL1 and CEL2 may be partially located to cover only the first end portion EP1 and the second end portion EP2 of the first light emitting element LD1, respectively. The first and second contact electrodes CEL1 and CEL2 may partially overlap the external circumferential surface (or the surface located in the third direction DR3) of the first light emitting element LD1 in the third direction DR3, but is not limited thereto. As shown in FIG. 9B, the first and second contact electrodes CEL1 and CEL2 entirely contact the first end portion EP1 and the second end portion EP2 of the first light emitting element LD1, but may not overlap the external circumferential surface (or the surface located in the third direction DR3) of the first light emitting element LD1 in third direction DR3.

As described above, the first and second contact electrodes CEL1 and CEL2 may be formed through processes that are different from those of the first electrode CNE1 and the first middle electrode CTE1. In addition, the first and second contact electrodes CEL1 and CEL2 may be partially provided or formed to cover only the first end portion EP1 and the second end portion EP2 of the first light emitting element LD1.

Figure 10:
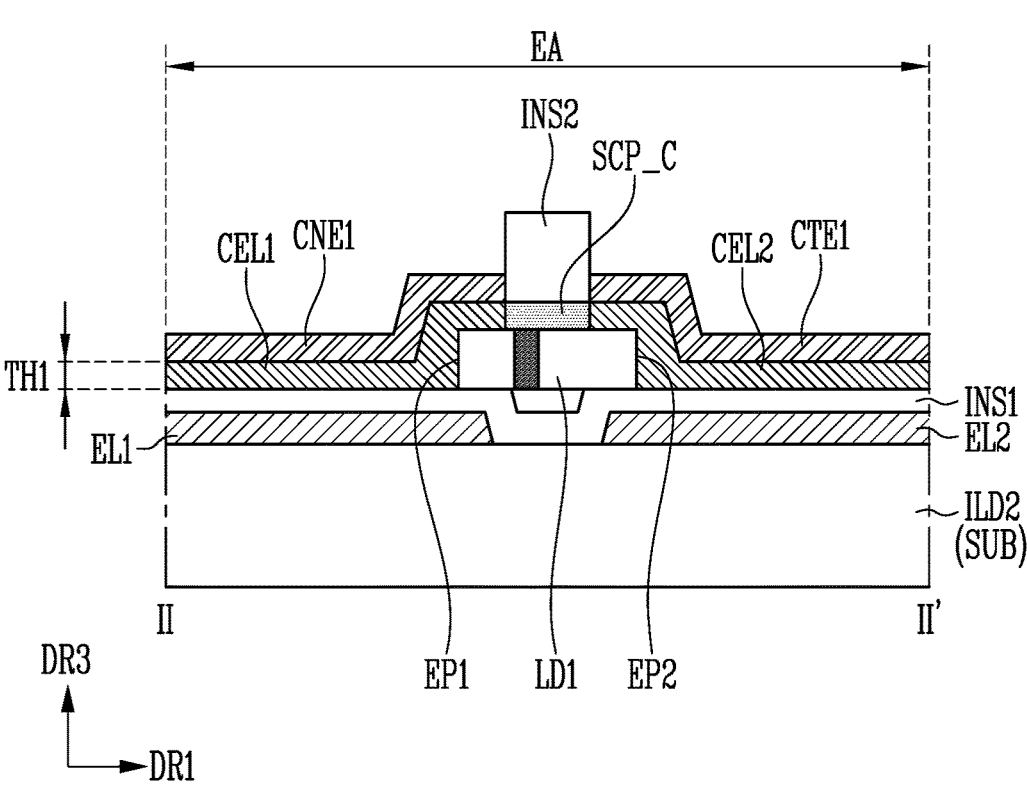
FIG. 10 illustrates a cross-sectional view of one or more other embodiments of a pixel taken along the line II-II' of FIG. 5.

FIG. 10 illustrates a cross-sectional view of one or more other embodiments of a pixel taken along the line II-II' of FIG. 5. FIG. 10 is a drawing corresponding to FIG. 7A.

Referring to FIG. 7A and FIG. 10, a semiconductor pattern SCP_C may be located between the first contact electrode CEL1 and the second contact electrode CEL2 in the first direction DR1, and/or between the first light emitting element LD1 and the second insulation film INS2 in the third direction DR3.

As will be described later with reference to FIG. 14, according to one or more embodiments, the first and second contact electrodes CEL1 and CEL2 and the semiconductor pattern SCP_C are concurrently or substantially simultaneously formed, and then, only the first and second contact electrodes CEL1 and CEL2 may be doped with an impurities through an implantation process. For example, only the first and second contact electrodes CEL1 and CEL2 may be doped with impurities by using the second insulation film INS2 (or a structure corresponding thereto) as a mask.

The semiconductor pattern SCP_C may form a channel between the first and second contact electrodes CEL1 and CEL2, but because the gate electrode with respect to the semiconductor pattern SCP_C is not formed, no current may flow through the semiconductor pattern SCP_C. A separate etching process for forming the first and second contact electrodes CEL1 and CEL2 may not be required.

However, to fundamentally block a leakage current through the semiconductor pattern SCP_C, the semiconductor pattern SCP_C may be removed through etching. In this case, one or more embodiments of FIG. 10 may be the same as one or more embodiments of FIG. 7A.

FIG. 11A to FIG. 11D illustrate cross-sectional views of one or more other embodiments of a pixel taken along the line II-II' of FIG. 5. FIG. 11A to FIG. 11D are drawings corresponding to FIG. 7A or FIG. 9B.

Referring to FIG. 7A, FIG. 9B, and FIG. 11A to FIG. 11D, first and second contact electrodes CEL1_1 and CEL2_1, a first electrode CNE1_1, and a first middle electrode CTE1_1 may be substantially the same as or similar to the first and second contact electrodes CEL1 and CEL2, the first electrode CNE1, and the first middle electrode CTE1 that are described with reference to FIG. 7A or FIG. 9B, respectively. Therefore, a duplicated description will not be repeated.

The first electrode CNE1_1 and the first middle electrode CTE1_1 may be different layers formed through different processes, or the first and second contact electrodes CEL1_1 and CEL2_1 may be different layers formed through different processes.

Figure 11A:
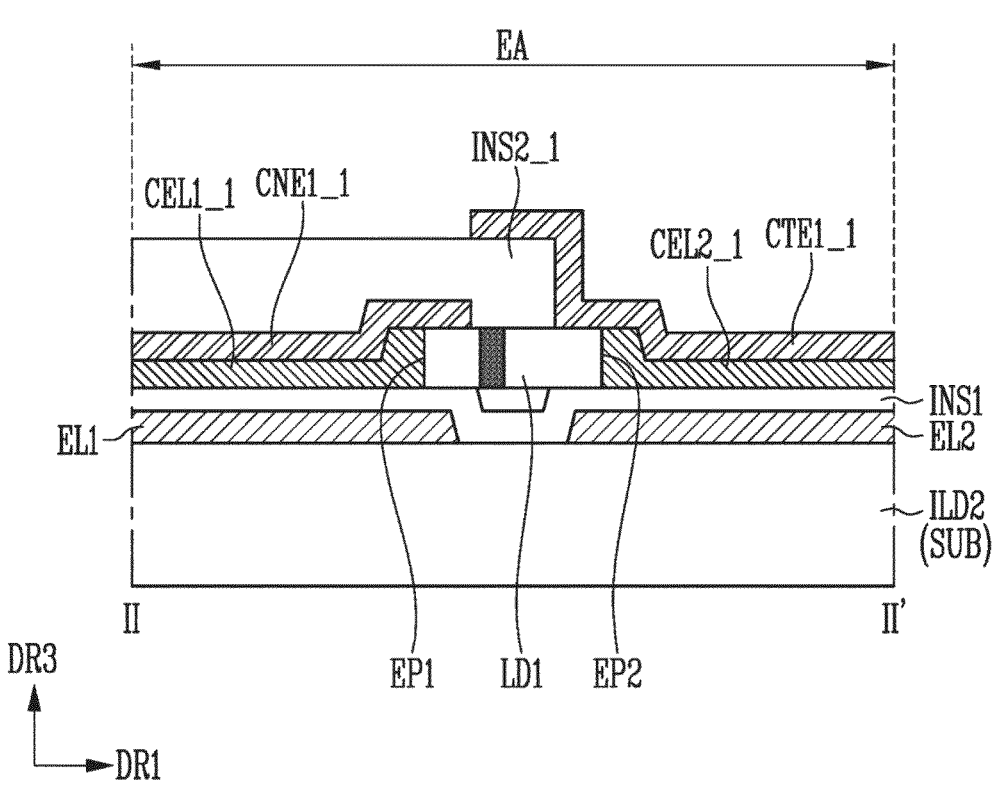
FIG. 11A to FIG. 11D illustrate cross-sectional views of one or more other embodiments of a pixel taken along the line II-II' of FIG. 5.

As shown in FIG. 11A, the first electrode CNE1_1 may be located on the first contact electrode CEL1 and the first end portion EP1 of the first light emitting element LD1. The second insulation film INS2_1 (or the second insulation pattern) is located on the first electrode CNE1_1, and may cover the first electrode CNE1_1. The second end portion EP2 of the first light emitting element LD1 may be exposed by the second insulation film INS2_1. The first middle electrode CTE1_1 may be located on the second contact electrode CEL2, the second end portion EP2 of the first light emitting element LD1, and the second insulation film INS2_1. The first middle electrode CTE1_1 may be spaced apart from the first electrode CNE1_1 with the second insulation film INS2_1 interposed therebetween.

Figure 11B:
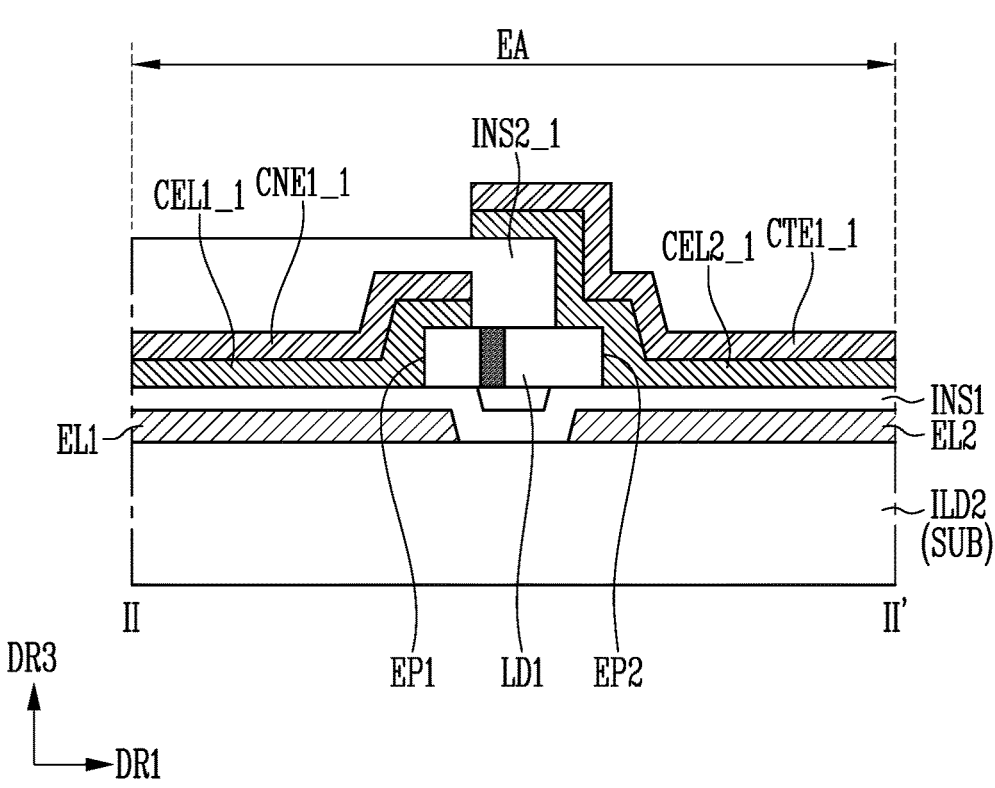

As shown in FIG. 11B, the first contact electrode CEL1_1 may cover the first end portion EP1 of the first light emitting element LD1. The first contact electrode CEL1_1 may be formed through the same etching process as the first electrode CNE1_1. The first electrode CNE1_1 may completely overlap the first contact electrode CEL1_1. The second contact electrode CEL2_1 may be located on the second end portion EP2 and the second insulation film INS2_1 of the first light emitting element LD1. The second contact electrode CEL2_1 may be spaced apart from the first contact electrode CEL1_1 with the second insulation film INS2_1 interposed therebetween. The first middle electrode CTE1_1 may be located on the second contact electrode CEL2_1. The first middle electrode CTE1_1 may completely overlap the second contact electrode CEL2_1.

Figure 11C:
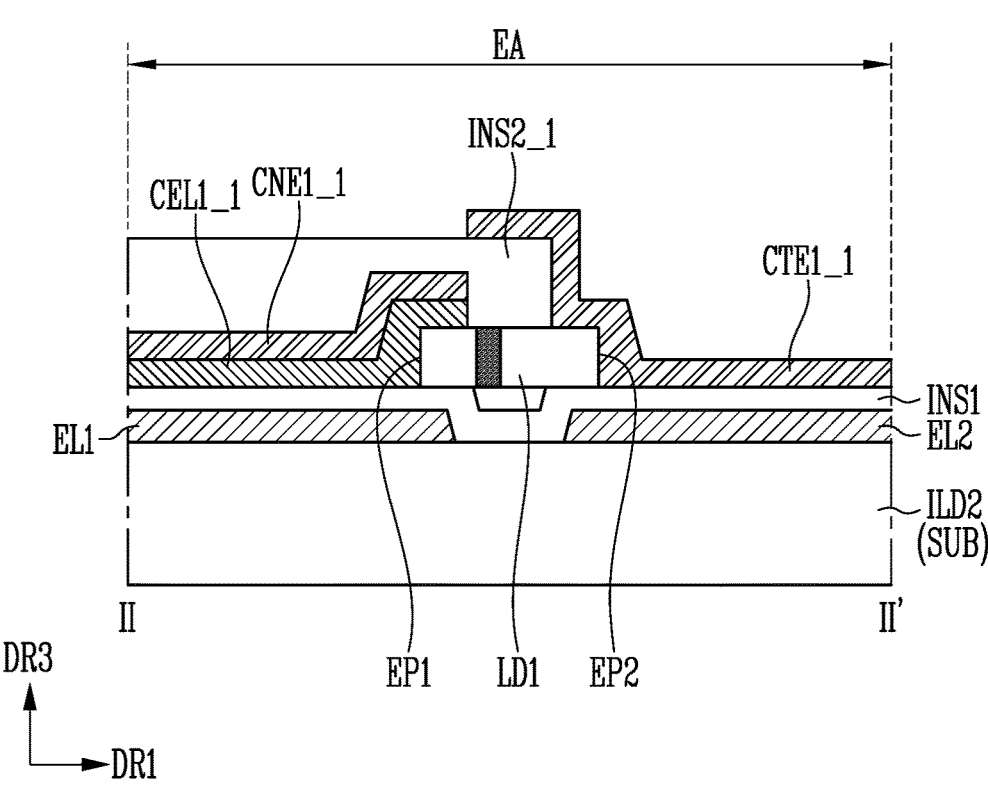
Figure 11D:
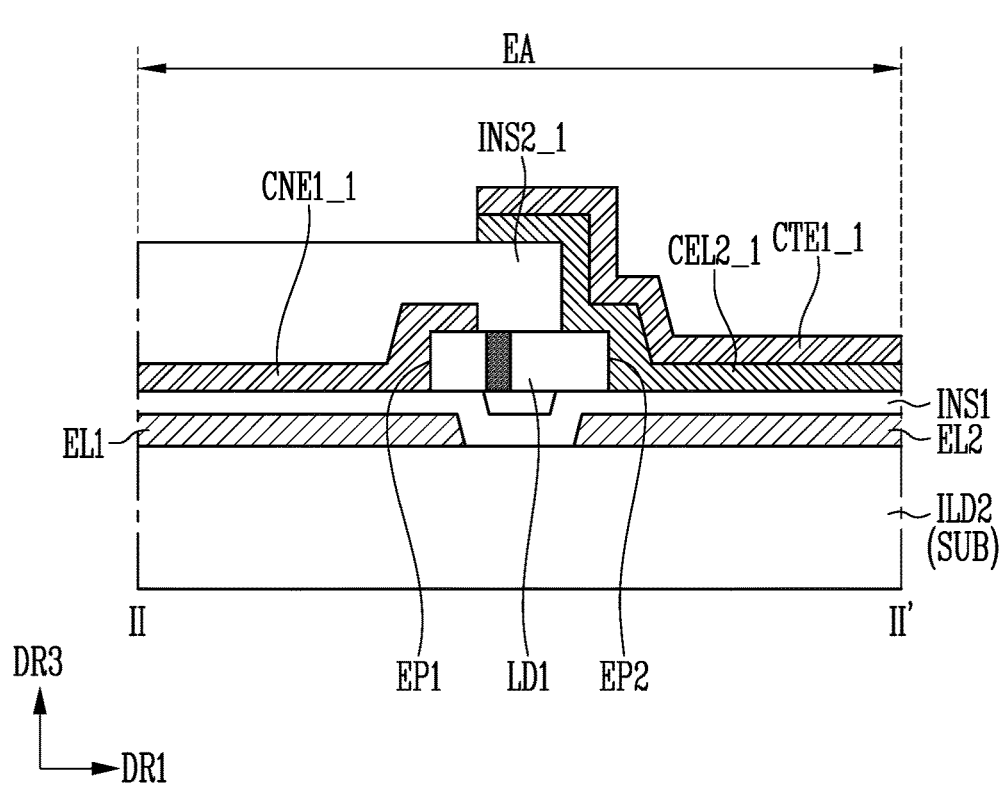

In one or more embodiments, one of the first contact electrode CEL1_1 and the second contact electrode CEL2_1 may be omitted. For example, when the first end portion EP1 of the first light emitting element LD1 is separated from a wafer and has an uneven surface, as shown in FIG. 11C, only the first contact electrode CEL1_1 in contact with the first end portion EP1 of the first light emitting element LD1 may be located, and the second contact electrode CEL2_1 may be omitted. As another example, when the second end portion EP2 of the first light emitting element LD1 is separated from a wafer and has an uneven surface, as shown in FIG. 11D, only the second contact electrode CEL2_1 in contact with the second end portion EP2 of the first light emitting element LD1 may be located, and the first contact electrode CEL1_1 may be omitted.

As described above, the first electrode CNE1_1 and the first middle electrode CTE1_1 may be at different layers formed through different processes, or the first and second contact electrodes CEL1_1 and CEL2_1 may be at different layers formed through different processes. In addition, one of the first contact electrode CEL1_1 and the second contact electrode CEL2_1 may be omitted.

FIG. 12A to FIG. 12D illustrate schematic cross-sectional views of a manufacturing method of a display device according to one or more embodiments of the present disclosure. FIG. 12A to FIG. 12D are drawings corresponding to FIG. 7A. For better understanding and ease of description, FIG. 12A to FIG. 12D briefly illustrate the display device DD (see FIG. 3) (or the pixel PXL, see FIG. 5) based on the light emitting unit EMU (see FIG. 4) (or the display element part DPL).

Figure 12A:
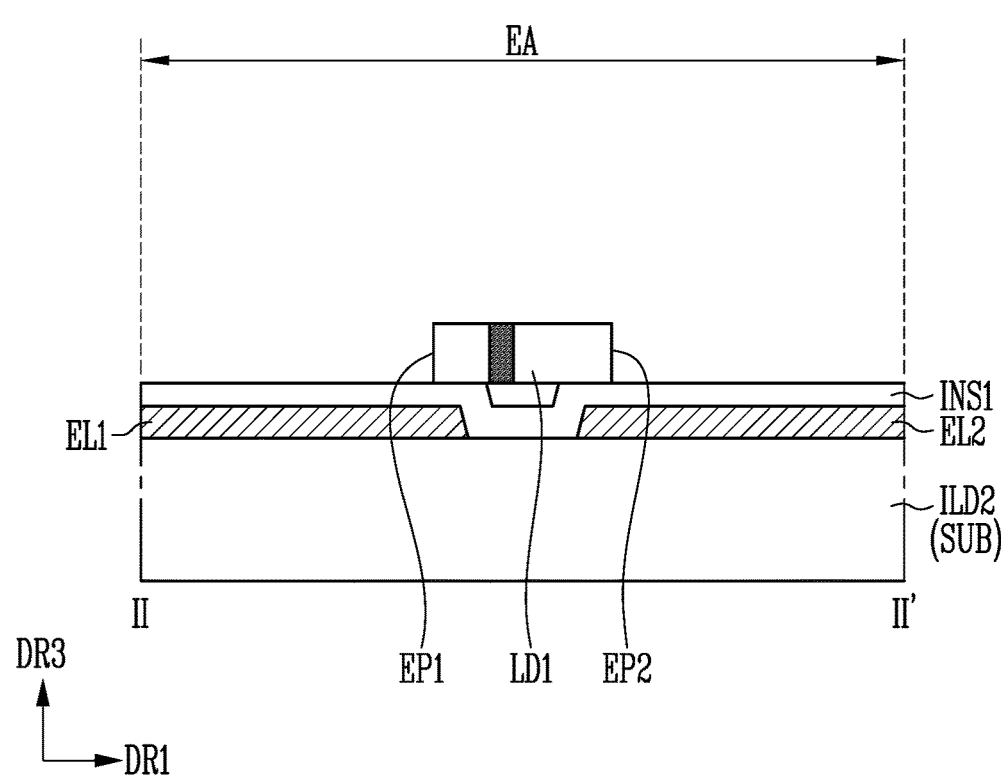
FIG. 12A to FIG. 12D illustrate schematic cross-sectional views of a manufacturing method of a display device according to one or more embodiments of the present disclosure.

First, referring to FIG. 7A and FIG. 12A, the first alignment electrode EU and the second alignment electrode EL2 spaced apart from each other in the first direction DR1 may be formed on the substrate SUB (or the second interlayer insulating film ILD2).

The first insulation film INS1 may be formed on the first alignment electrode EL1 and the second alignment electrode EL2. The first insulation film INS1 may be formed on the substrate SUB to cover the first alignment electrode EU and the second alignment electrode EL2, and then, the first insulation film INS1 may be partially opened to expose an area of each of the first alignment electrode EL1 and the second alignment electrode EL2 (see FIG. 6A). Alternatively, the first insulation film INS1 may be patterned in a form of an individual pattern that is locally located under the first light emitting element LD1.

The first light emitting element LD1 may be located on the first insulation film INS1 between the first alignment electrode EL1 and the second alignment electrode EL2.

As described above, the first light emitting element LD1 may be prepared in a dispersed form in a solution (e.g., a predetermined solution) to be supplied to the light emitting area EA (see FIG. 5) of the pixel area PXA through an inkjet printing or slit coating method. When a voltage (e.g., a predetermined voltage) is applied between the first alignment electrode EL1 and the second alignment electrode EL2, as an electric field is formed between the first alignment electrode EL1 and the second alignment electrode EL2, the first light emitting element LD1 is self-aligned between the first alignment electrode EL1 and the second alignment electrode EL2. After the first light emitting element LD1 is aligned, the first light emitting element LD1 may be stably arranged between the first alignment electrode EL1 and the second alignment electrode EL2 by volatilizing the solvent or removing it in other ways.

Figure 12B:
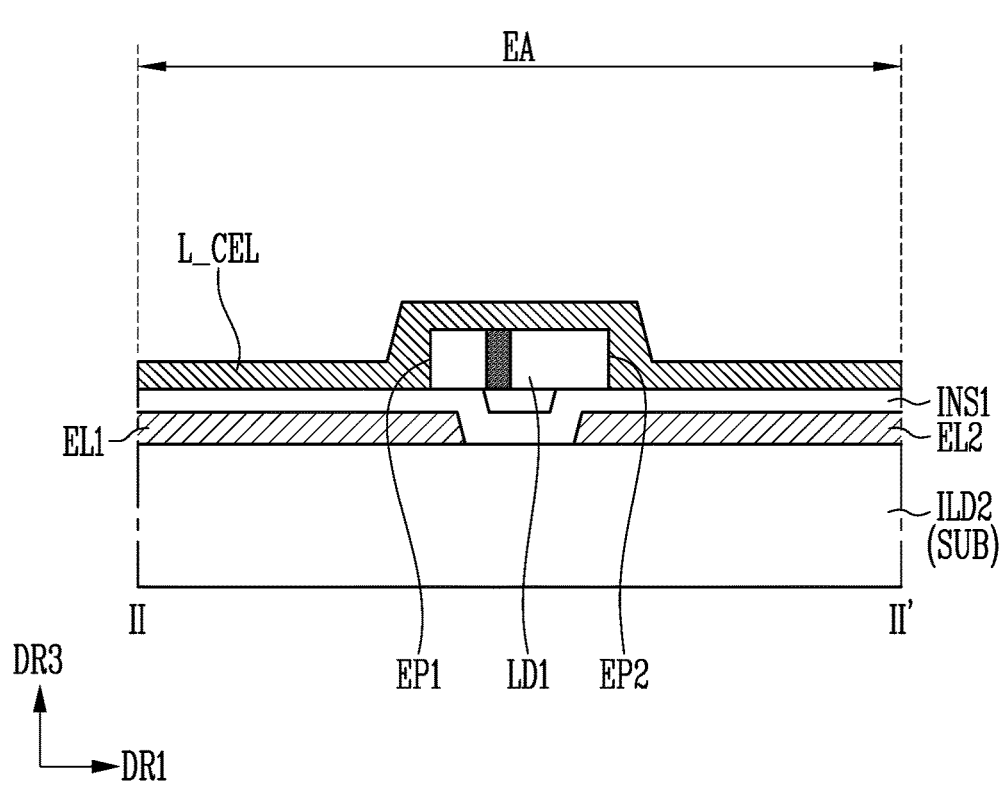

Thereafter, as shown in FIG. 12B, a first electrode layer L_CEL (or a contact electrode layer) covering the first alignment electrode EL1, the second alignment electrode EL2, and the first light emitting element LD1 may be deposited or formed. The first electrode layer L_CEL may be entirely formed on the substrate SUB. The first electrode layer L_CEL may be formed through chemical vapor deposition, and may have a relatively high step coverage characteristic. The first electrode layer L_CEL may include a doped semiconductor material, for example, an amorphous silicon doped with an n-type impurity (that is, n+ a-Si).

Figure 12C:
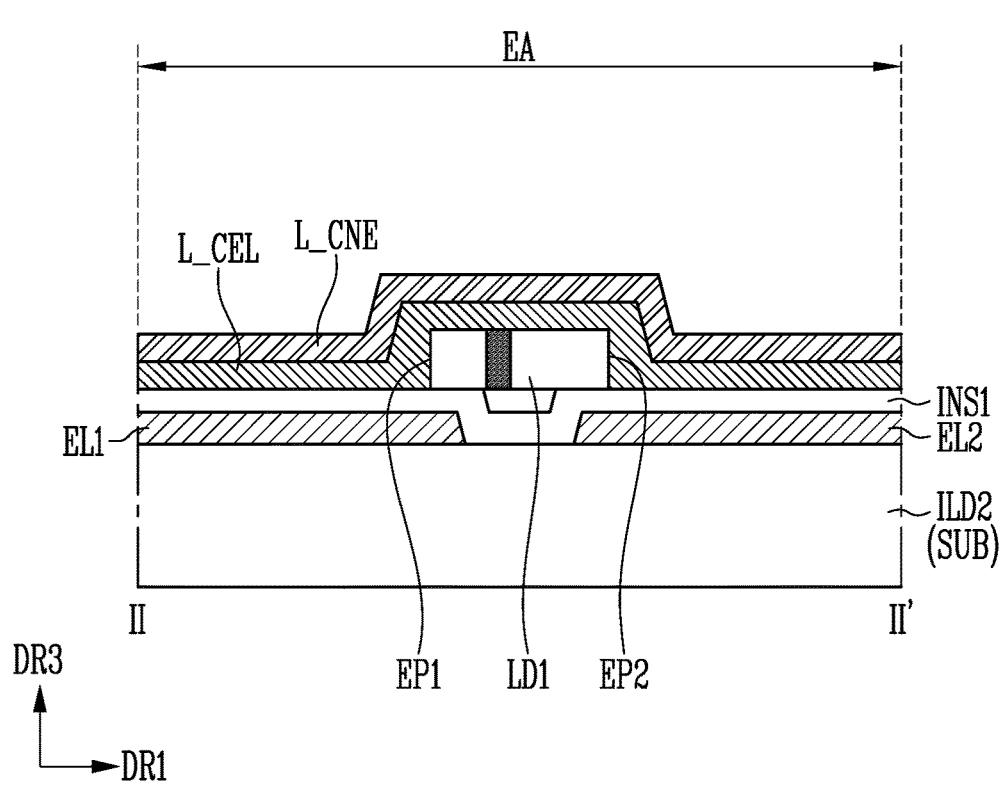

Then, as shown in FIG. 12C, a second electrode layer L_CNE (or a pixel electrode layer) may be formed on the first electrode layer L_CEL. The second electrode layer L_CNE may include a transparent conductive material, for example, an indium tin oxide (ITO).

Figure 12D:
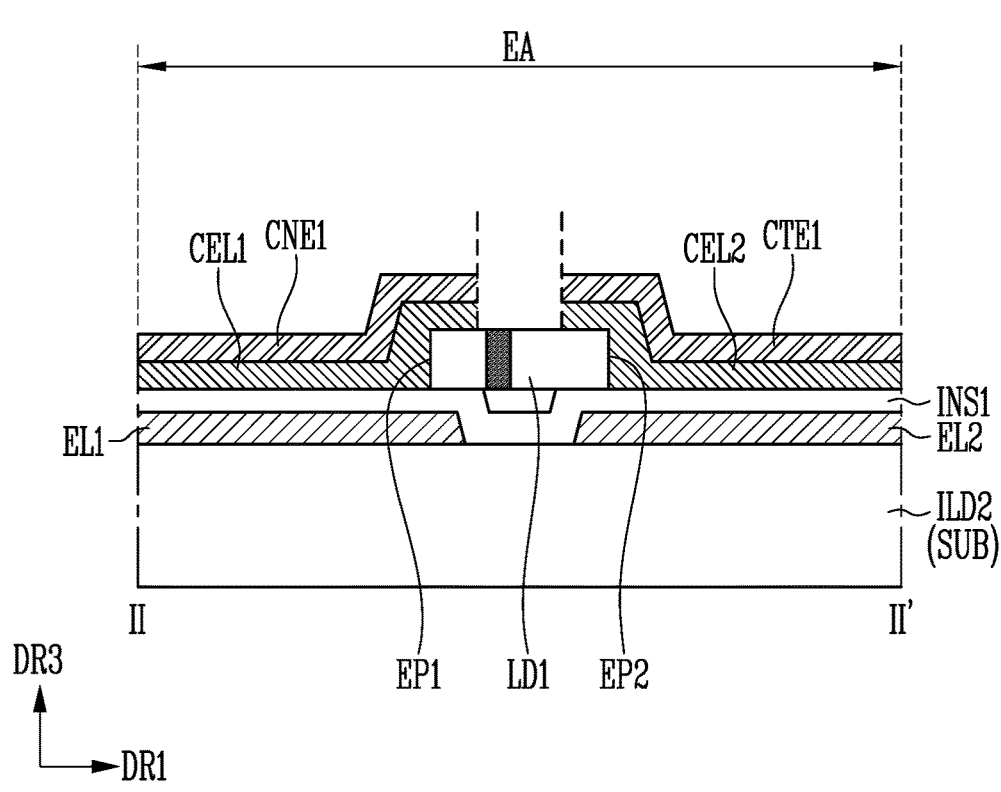

Then, as shown in FIG. 12D, the first and second contact electrodes CEL1 and CEL2 may be formed from the first electrode layer L_CEL through an etching process. At the same time, the first electrode CNE1 and the first middle electrode CTE1 may be formed from the second electrode layer L_CNE. That is, the first and second contact electrodes CEL1 and CEL2, the first electrode CNE1, and the first middle electrode CTE1 may be concurrently or substantially simultaneously formed through one etching process using the same mask.

Next, the second insulation film INS2 may be formed between the first and second contact electrodes CEL1 and CEL2 and between the first electrode CNE1 and the first middle electrode CTE1. Because the second insulation film INS2 is formed after the formation of the first electrode CNE1 and the first middle electrode CTE1, the second insulation film INS2 may have a reverse tapered cross-sectional shape (see FIG. 7B), or the second insulation film INS2 may be located on the first electrode CNE1 and the first middle electrode CTE1 (see FIG. 7C).

As described above, the first and second contact electrodes CEL1 and CEL2 contacting the first and second end portions EP1 and EP2 of the first light emitting element LD1 may be formed through chemical vapor deposition, and the first and second contact electrodes CEL1 and CEL2 may have a relatively high step coverage characteristic. Accordingly, a side contact area of the first light emitting element LD1 with respect to the first and second contact electrodes CEL1 and CEL2 may be sufficiently secured, and accordingly, an increase in contact resistance or defective contact between the first light emitting element LD1 and the first and second contact electrodes CEL1 and CEL2 may be reduced or prevented.

In addition, the first and second contact electrodes CEL1 and CEL2, the first electrode CNE1, and the first middle electrode CTE1 may be concurrently or substantially simultaneously formed through the same etching process, and thus the manufacturing process may be relatively simplified.

Figure 13A:
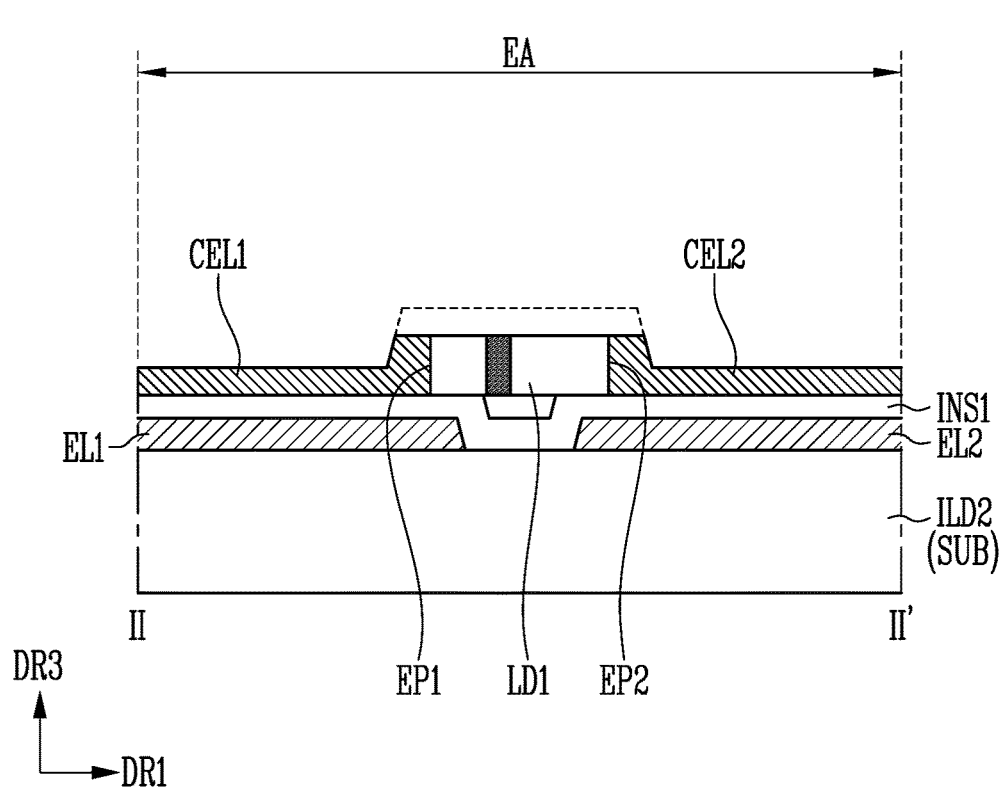
FIG. 13A to FIG. 13C illustrate schematic cross-sectional views of a manufacturing method of a display device according to one or more other embodiments of the present disclosure.
Figure 13B:
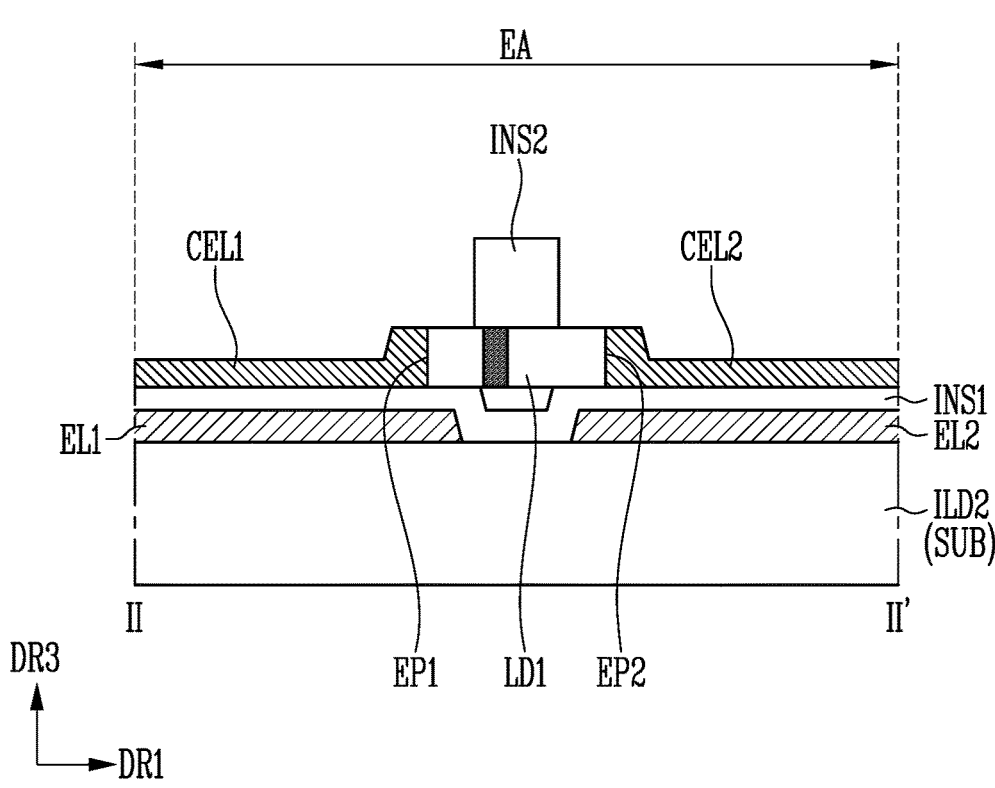
Figure 13C:
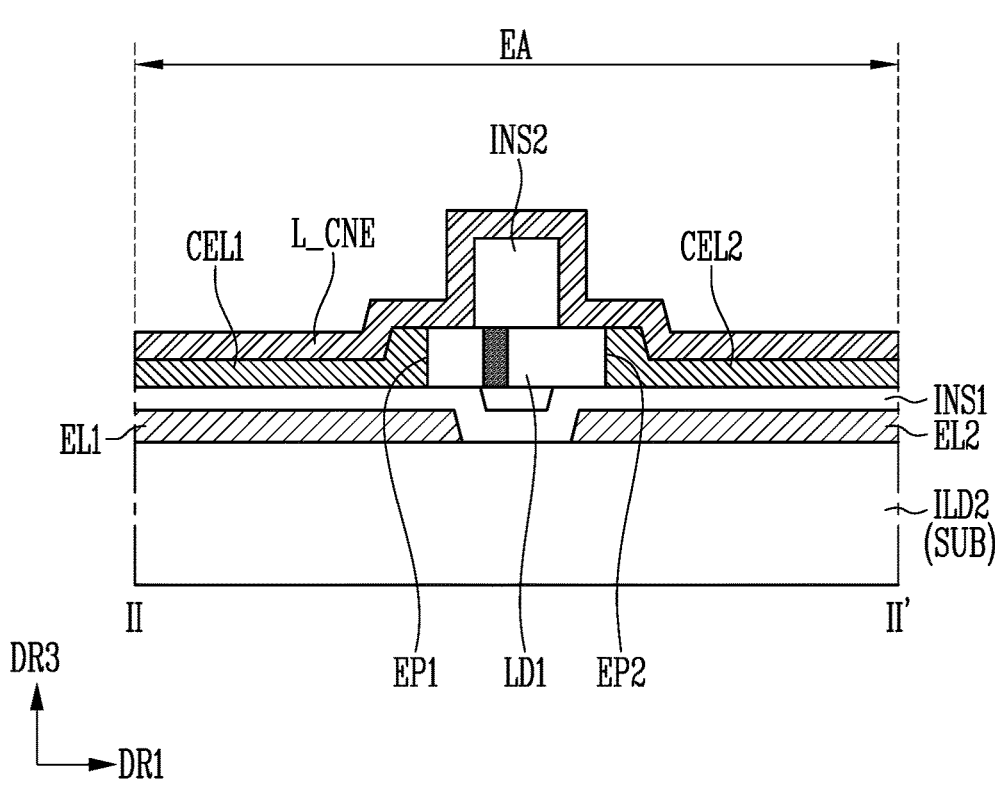

FIG. 13A to FIG. 13C illustrate schematic cross-sectional views of a manufacturing method of a display device according to one or more other embodiments of the present disclosure. FIG. 13A to FIG. 13C are drawings corresponding to FIG. 9B (or FIG. 9A). For better understanding and ease of description, FIG. 13A to FIG. 13C briefly illustrate the display device DD (see FIG. 3), or the pixel PXL (see FIG. 5) based on the light emitting unit EMU (see FIG. 4) or the display element part DPL.

Referring to FIG. 9A, FIG. 9B, FIG. 12A, FIG. 12B, and FIG. 13A to FIG. 13C, the method of FIG. 13A and FIG. 13B may be performed after the formation of the first electrode layer L_CEL (or contact electrode layer) of FIG. 12B.

As shown in FIG. 13A, the first and second contact electrodes CEL1 and CEL2 may be formed from the first electrode layer L_CEL through an etching process. Depending on the mask used in the etching process or the etching time, the first and second contact electrodes CEL1 and CEL2 may completely expose the upper portion of the first light emitting element LD1, or may partially overlap the upper portion of the first light emitting element LD1 (see FIG. 9A).

Thereafter, as shown in FIG. 13B, the second insulation film INS2 (or second insulation pattern) may be formed on the first light emitting element LD1. The second insulation film INS2 may expose the first and second end portions EP1 and EP2 of the first light emitting element LD1. The second insulation film INS2 may reduce or prevent the likelihood of the first light emitting element LD1 being separated from the first insulation film INS1.

Then, as shown in FIG. 13C, the second electrode layer L_CNE (or pixel electrode layer) may be formed on the substrate SUB to cover the first light emitting element LD1 and the first and second contact electrodes CEL1 and CEL2.

Then, the first electrode CNE1 and the first middle electrode CTE1 may be formed by etching or cutting a portion of the second electrode layer L_CNE overlapping the second insulation film INS2 (refer to FIG. 9B).

As described above, the first and second contact electrodes CEL1 and CEL2 may be formed through processes different from those of the first electrode CNE1 and the first middle electrode CTE1. In addition, the first and second contact electrodes CEL1 and CEL2 may be partially provided or formed to cover only the first end portion EP1 and the second end portion EP2 of the first light emitting element LD1.

As shown in FIG. 13A and FIG. 13B, it has been described that the second insulation film INS2 is formed after the first and second contact electrodes CEL1 and CEL2 are formed, but the present disclosure is not limited thereto. For example, after the first light emitting element LD1 is aligned, the second insulation film INS2 may be formed, the first electrode layer L_CEL may be formed to cover the second insulation film INS2, and the first and second contact electrodes CEL1 and CEL2 may be formed from the first electrode layer L_CEL. In addition, by sequentially stacking the first electrode layer L_CEL and the second electrode layer L_CNE, and by concurrently or substantially simultaneously etching the first electrode layer L_CEL and the second electrode layer L_CNE, the first and second contact electrodes CEL1 and CEL2, the first electrode CNE1, and first middle electrode CTE1 may be concurrently or substantially simultaneously formed.

Figure 14:
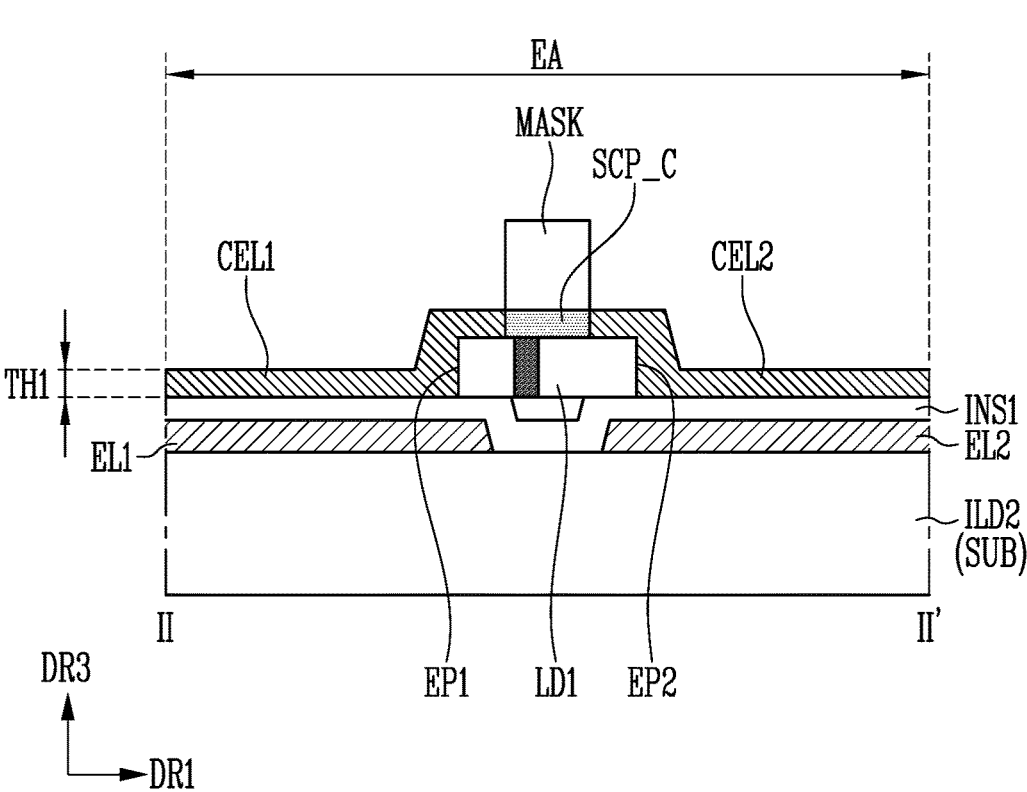
FIG. 14 illustrates a schematic cross-sectional view of a manufacturing method of a display device according to one or more other embodiments of the present disclosure.

FIG. 14 illustrates a schematic cross-sectional view of a manufacturing method of a display device according to one or more other embodiments of the present disclosure. FIG. 14 is a drawing corresponding to FIG. 10. For better understanding and ease of description, FIG. 10 briefly illustrates the display device DD (see FIG. 3), or the pixel PXL (see FIG. 5) based on the light emitting unit EMU (see FIG. 4) or the display element part DPL.

Referring to FIG. 10, FIG. 12A, FIG. 12B, and FIG. 14, the method of FIG. 14 may be performed after the first electrode layer L_CEL (or contact electrode layer) of FIG. 12B is formed.

As shown in FIG. 14, a mask (MASK) may be formed on the first electrode layer L_CEL. The mask (MASK) may correspond to the second insulation film INS2.

Thereafter, portions of the first electrode layer L_CEL exposed by the mask (MASK) through the implantation process may be doped with impurities. Through this, the first and second contact electrodes CEL1 and CEL2 may be formed.

Thereafter, the first electrode CNE1 and first middle electrode CTE1 may be formed (see FIG. 10).

While the present disclosure has been shown and described with reference to certain embodiments thereof, it will be understood by those skilled in the art that various changes in forms and details may be made therein without departing from the spirit and scope of the present disclosure as defined by the appended claims and their equivalents. Therefore, the technical scope of the present disclosure may be determined by on the technical scope of the accompanying claims, with the functional equivalents thereof to be included therein.

What is claimed is:

1. A display device, comprising:
a substrate;
a light emitting element on the substrate, and comprising a first end portion and a second end portion that are aligned in a first direction that is substantially parallel to an upper surface of the substrate;
a first contact electrode in contact with the first end portion of the light emitting element;
a first electrode above the first contact electrode such that one end portion of the first contact electrode is between one end portion of the first electrode and the light emitting element in a thickness direction perpendicular to a direction from the first end portion to the second end portion, and such that the light emitting element is between the substrate and both of the one end portion of the first contact electrode and the one end portion of the first electrode, the first electrode being electrically connected to the first end portion of the light emitting element through the first contact electrode; and
a second electrode electrically connected to the second end portion of the light emitting element.

2. The display device of claim 1, further comprising a bank on the substrate in a non-light emitting area, and defining a light emitting area of a pixel,
wherein the light emitting element is between the first electrode and the second electrode in the light emitting area.

3. The display device of claim 1, wherein the first contact electrode comprises an amorphous silicon.

4. The display device of claim 3, wherein the first contact electrode is doped with an n-type impurity.

5. The display device of claim 3, wherein the first contact electrode is doped with a p-type impurity.

6. The display device of claim 3, wherein a thickness of the first contact electrode is about 1000 Å or less.

7. The display device of claim 1, further comprising:
a first alignment electrode and a second alignment electrode on the substrate, and spaced apart from each other in the first direction; and
a first insulation pattern covering the first alignment electrode and the second alignment electrode, and located between the first alignment electrode and the first contact electrode,
wherein the light emitting element is on the first insulation pattern between the first alignment electrode and the second alignment electrode.

8. The display device of claim 7, further comprising a second insulation pattern on the light emitting element, and exposing the first end portion and the second end portion of the light emitting element.

9. The display device of claim 8, wherein the one end portion of the first contact electrode and the one end portion of the first electrode are in contact with a side surface of the second insulation pattern, and
wherein the one end portion of the first contact electrode and the one end portion of the first electrode have a same etching profile.

10. The display device of claim 9, wherein the second insulation pattern has a reverse tapered cross-sectional shape.

11. The display device of claim 9, wherein the second insulation pattern is partially on the first electrode.

12. The display device of claim 8, wherein the first contact electrode is spaced apart from the second insulation pattern, and
wherein the first electrode covers the first contact electrode.

13. The display device of claim 1, further comprising a second contact electrode in contact with the second end portion of the light emitting element,
wherein the second electrode is on the second contact electrode, and is electrically connected to the second end portion of the light emitting element through the second contact electrode.

14. The display device of claim 13, wherein the first contact electrode and the second contact electrode are at a same layer.

15. The display device of claim 14, wherein the first electrode and the second electrode are at a same layer.

16. The display device of claim 14, wherein the first electrode and the second electrode are at different respective layers.

17. The display device of claim 13, wherein the first contact electrode and the second contact electrode are at different layers with an insulation pattern interposed therebetween.

\* \* \* \* \*